United States Patent
Takano et al.

(10) Patent No.: US 6,535,427 B1
(45) Date of Patent: Mar. 18, 2003

(54) NONVOLATILE SEMICONDUCTOR MEMORY DEVICE WITH INITIALIZATION CIRCUIT AND CONTROL METHOD THEREOF

(75) Inventors: Yoshinori Takano, Ichikawa (JP); Toru Tanzawa, Ebina (JP); Tadayuki Taura, Zushi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 267 days.

(21) Appl. No.: 09/707,983

(22) Filed: Nov. 8, 2000

(30) Foreign Application Priority Data

Nov. 12, 1999 (JP) ............................................ 11-322548

(51) Int. Cl.⁷ .............................................. G11C 16/26
(52) U.S. Cl. ............................ 365/185.21; 365/185.18; 365/185.2; 365/185.17
(58) Field of Search ....................... 365/185.21, 185.17, 365/185.18, 185.2

(56) References Cited

U.S. PATENT DOCUMENTS

| 5,163,021 A | 11/1992 | Mehrotra et al. ...... 365/185.03 |
| 5,559,737 A | 9/1996 | Tanaka et al. ......... 365/185.25 |
| 5,844,851 A | * 12/1998 | Pascucci et al. ............ 365/210 |
| 6,307,807 B1 | * 10/2001 | Sakui et al. ............. 365/238.5 |

FOREIGN PATENT DOCUMENTS

| JP | 61-222093 | 11/1986 |
| JP | 7-1301900 | 5/1995 |
| JP | 10-255492 | 9/1998 |

OTHER PUBLICATIONS

U.S. patent application Ser. No. 09/584,137 filed May 31, 2000; entitled "Semiconductor Memory Device" to Toru Tanzawa et al.

"Fast Programmable 256K Read Only Memory with On–Chip Test Circuits," Shigeru Atsumi, et al., IEEE Journal of Solid–State Circuits, vol. sc–20, No. 1, Feb. 1985, pp.422–427.

"A 256–kbit Flash E2PROM Using Triple–Polysilicon Technology," Fujio Masuoka, et al., IEEE Journal of Solid–state Circuits, vol. sc–22, No. 4, Aug. 1987, pp. 548–552.

"A 3.3V 16Mb Flash Memory with Advanced Write Automation," Alan Baker et al., IEEE International Solid–state Circuits Conference, IEEE ISSCC Digest of Technical Papers, pp.146–147, Feb. 17, 1994.

* cited by examiner

Primary Examiner—Andrew Q. Tran
(74) Attorney, Agent, or Firm—Banner & Witcoff, Ltd.

(57) ABSTRACT

A memory cell is connected to a cell-based bit line. The cell-based bit line is connected to a bit line via a Y decoder. The bit line is connected to a sense bit line via a separation circuit. This sense bit line is connected to a sense line via a bias circuit. An amplifier circuit amplifies a signal voltage on the sense line together with a reference voltage for sensing data. The sense line is connected with a sense line initialization circuit for setting the sense line to a specified voltage. The bit line is connected with a bit line initialization circuit for setting the bit line to a specified voltage. Both the sense line initialization circuit and the bit line initialization circuit are activated in a given period before the amplifier circuit operates to sense data. Thus, the sense line and the bit line are set to specified voltages.

47 Claims, 17 Drawing Sheets

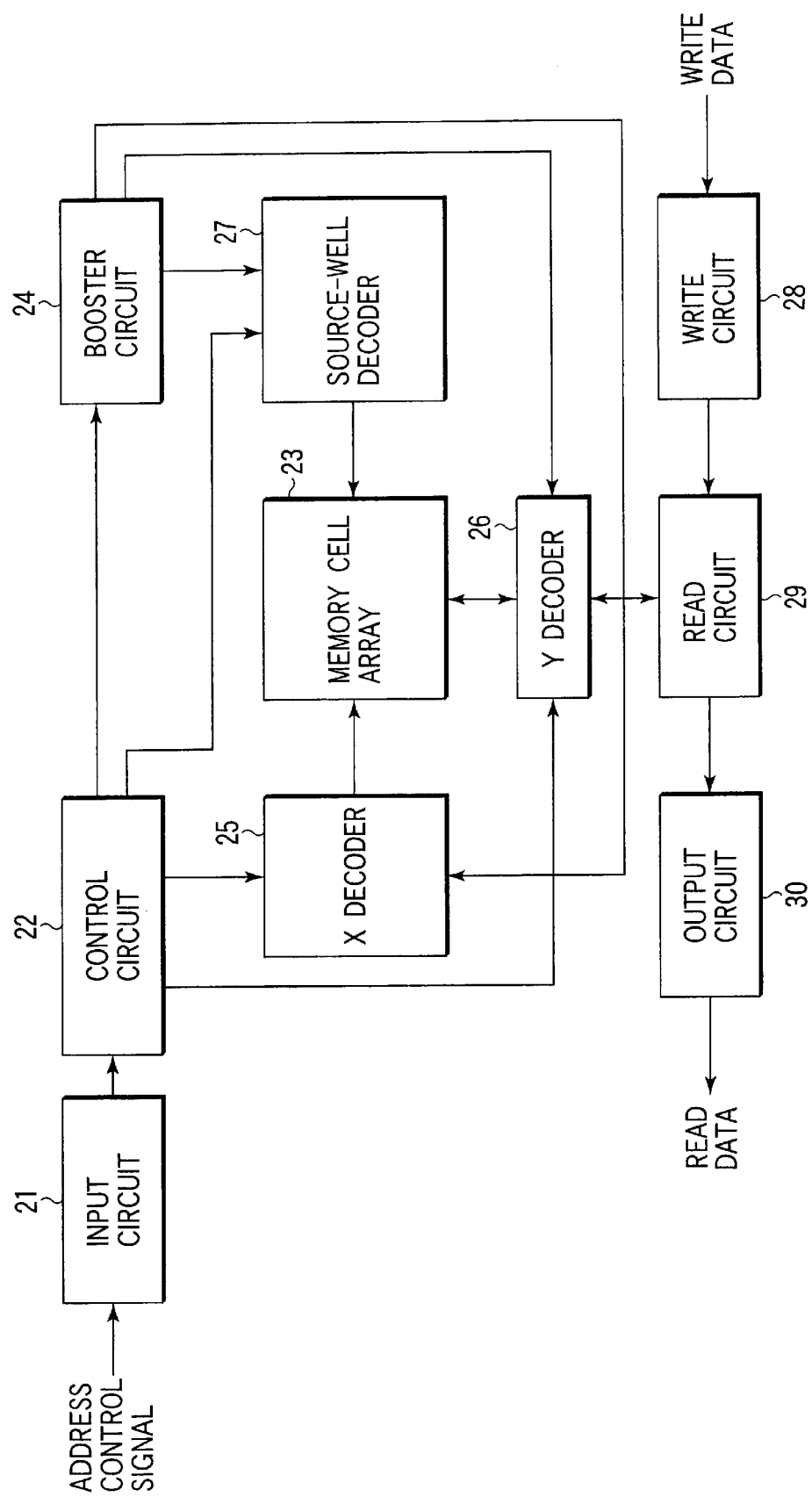
F I G. 9

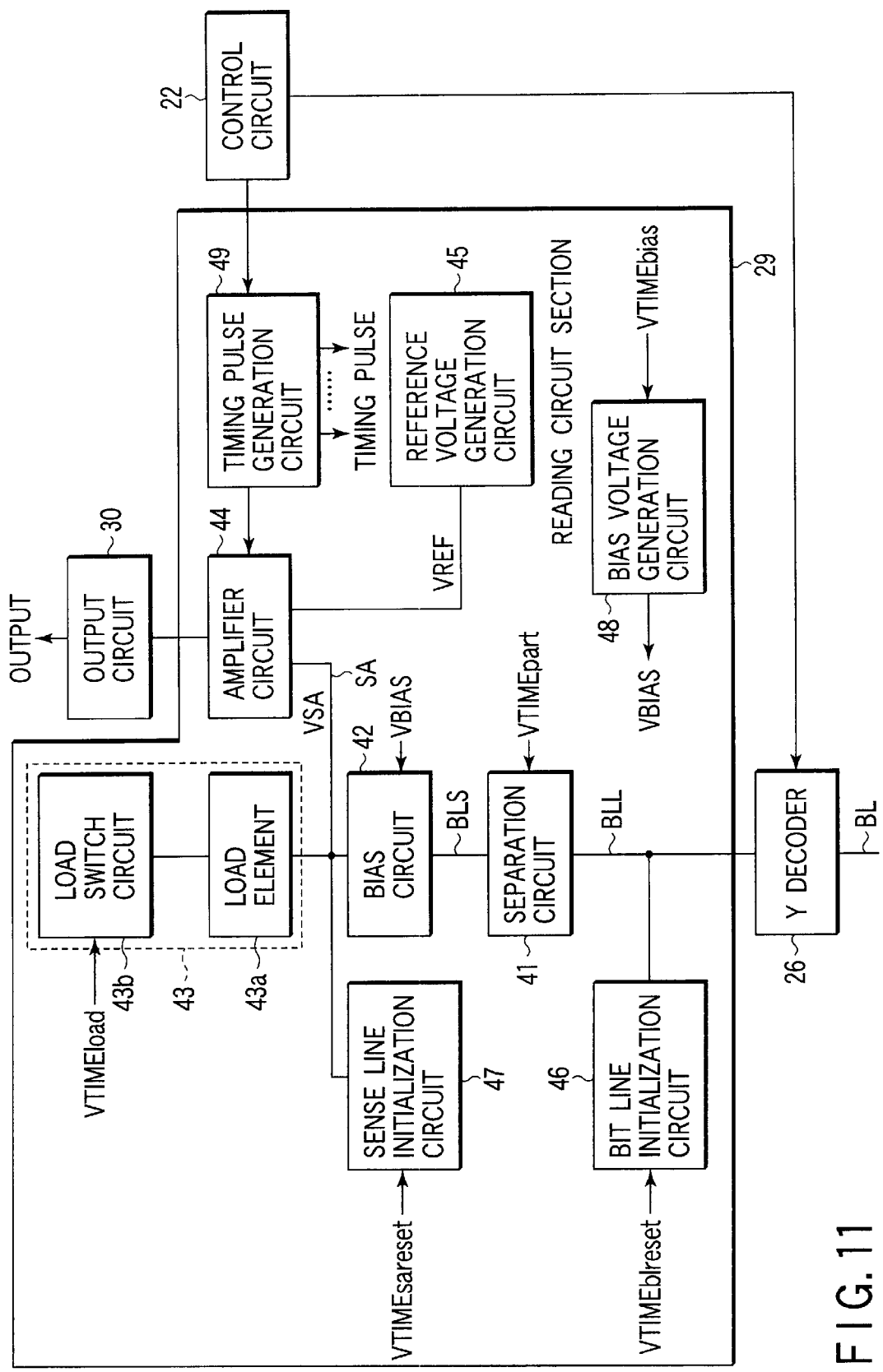
F I G. 11

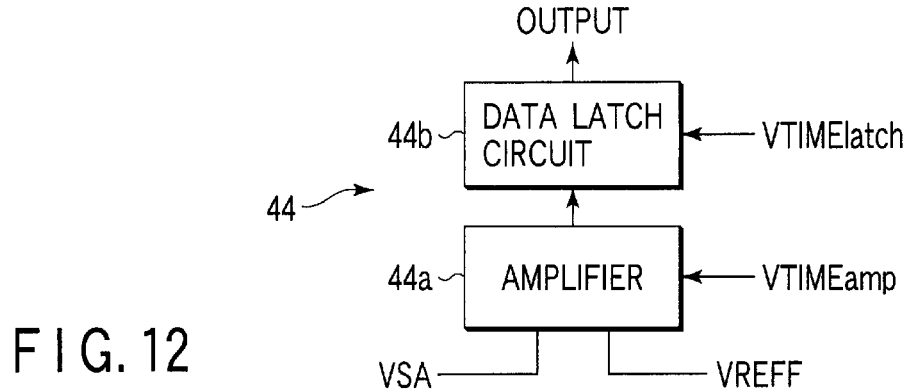
FIG. 12
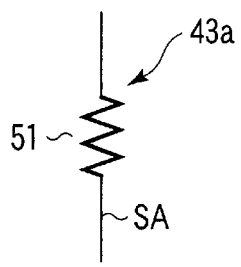
FIG. 13A
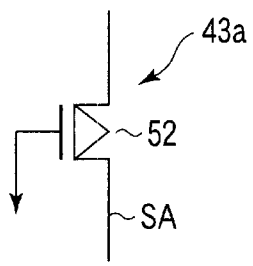
FIG. 13B
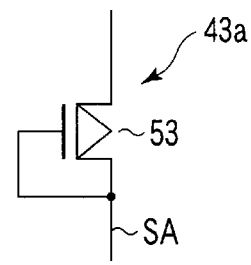
FIG. 13C
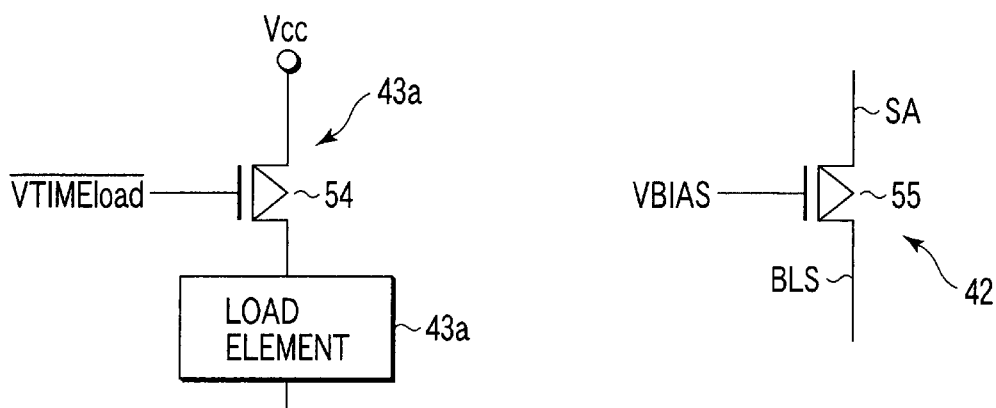
FIG. 14
FIG. 15

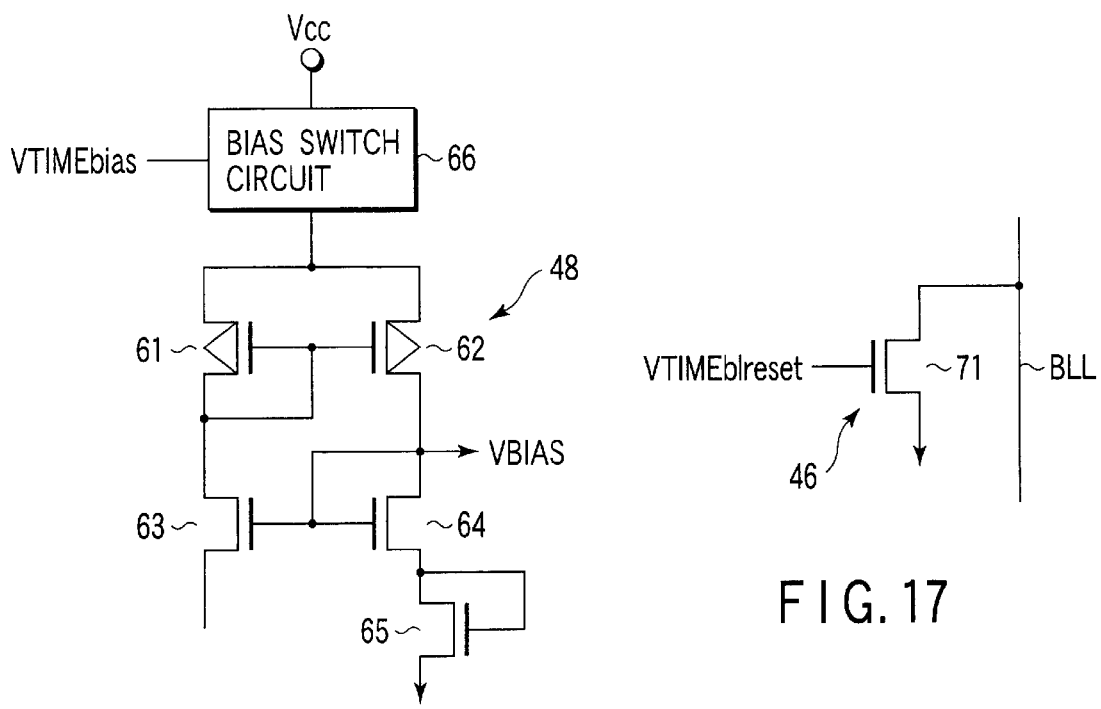
FIG. 16
FIG. 17
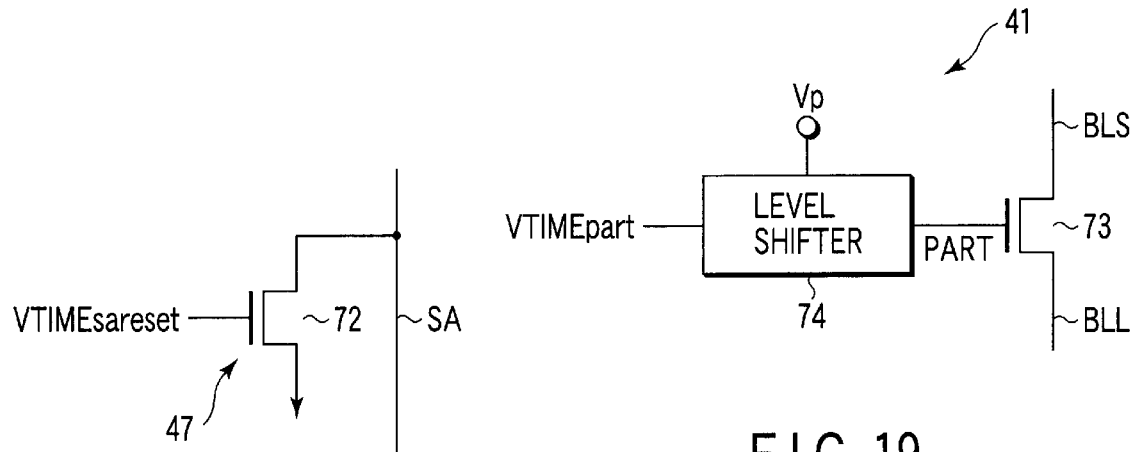
FIG. 18
FIG. 19

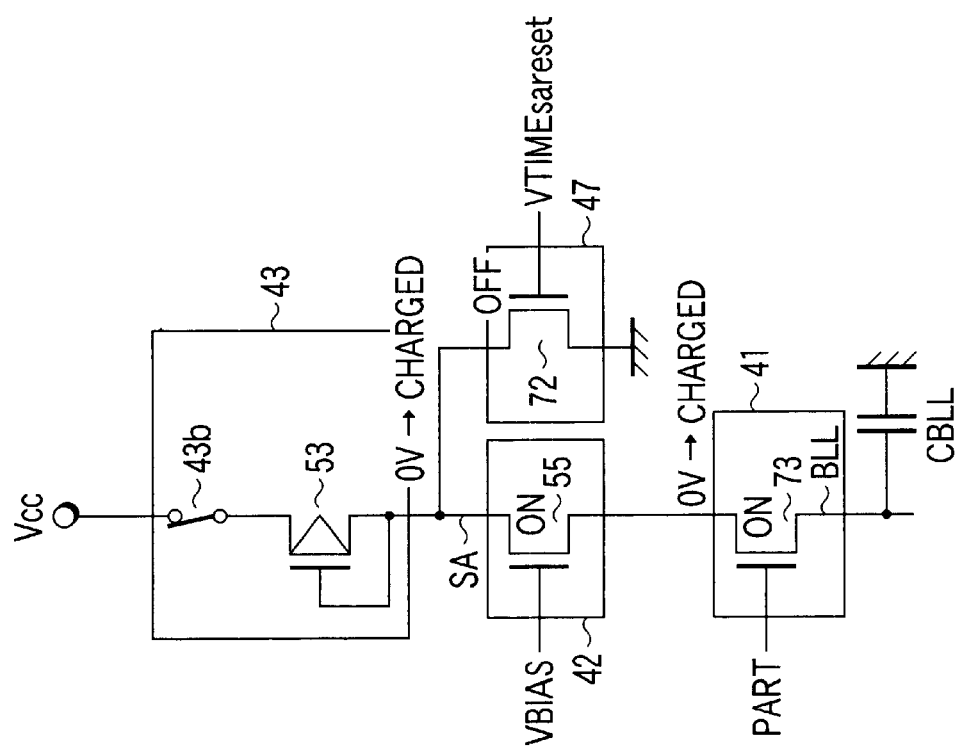
F I G. 22B
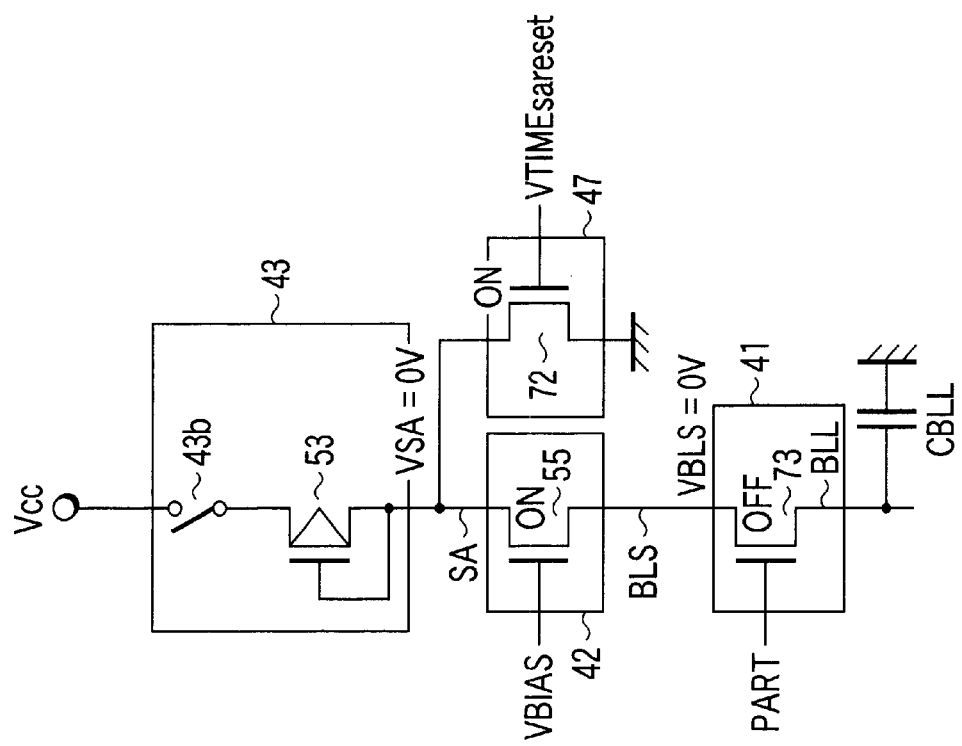
F I G. 22A

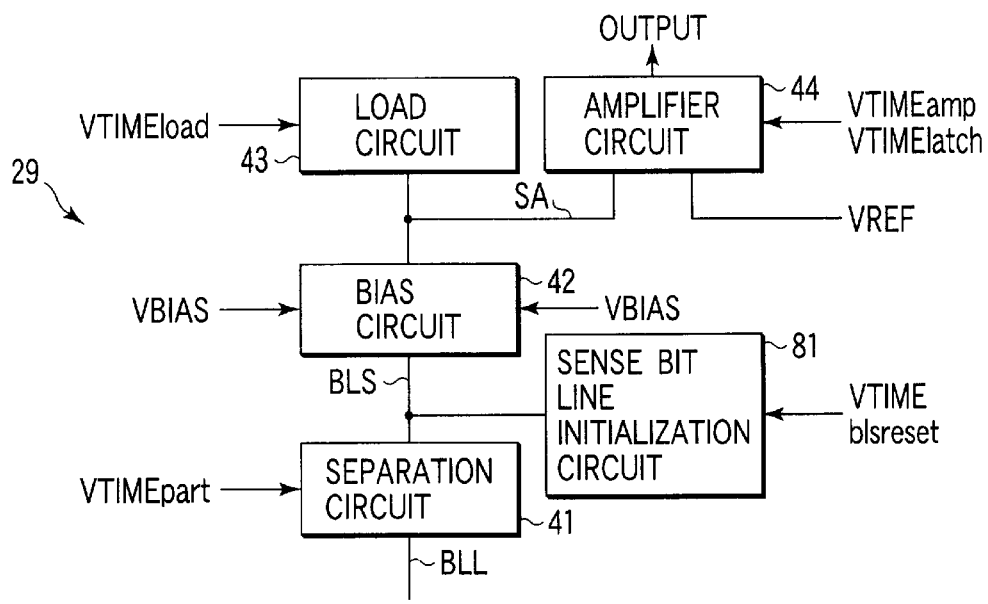
F I G. 25
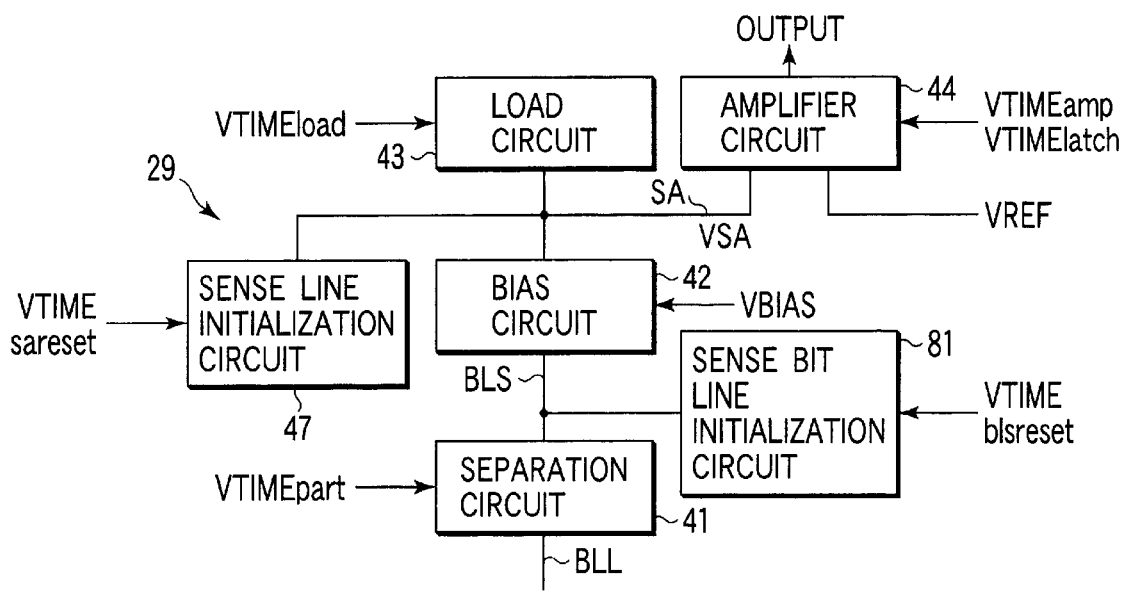
F I G. 26

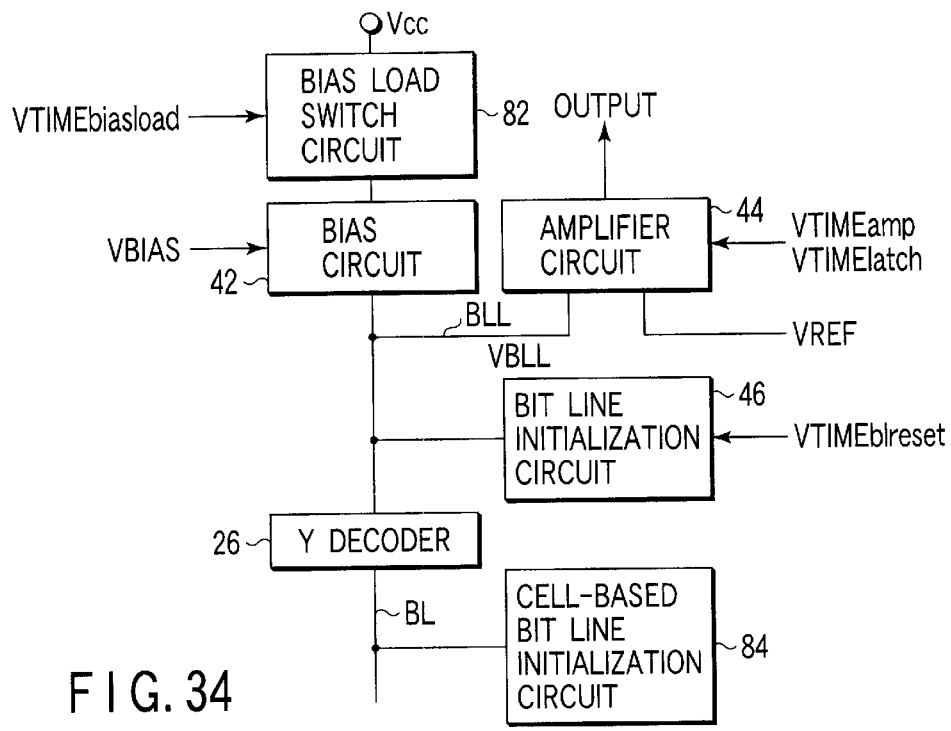
F I G. 34
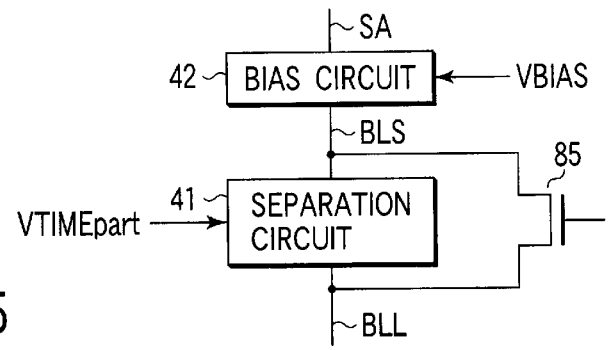
F I G. 35
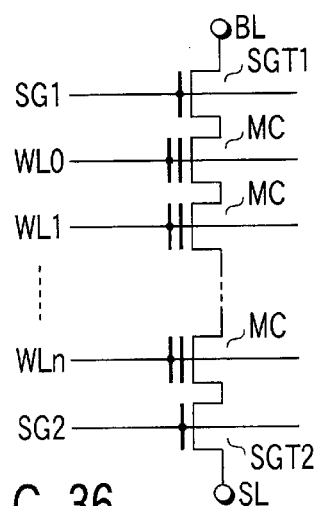
F I G. 36
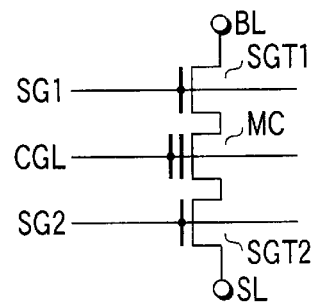
F I G. 37

NONVOLATILE SEMICONDUCTOR MEMORY DEVICE WITH INITIALIZATION CIRCUIT AND CONTROL METHOD THEREOF

CROSS-REFERENCE TO RELATED APPLICATIONS

This application is based upon and claims the benefit of priority from the prior Japanese Patent Application No. 11-322548, filed Nov. 12, 1999, the entire contents of which are incorporated herein by reference.

BACKGROUND OF THE INVENTION

The present invention relates to a read circuit which read data stored in a memory cell, nonvolatile semiconductor memory device having an improved read method, and a control method thereof.

Nonvolatile memory (EEPROM) is widely known as semiconductor memory which retains data written in a memory cell with no power voltage supplied. A type of nonvolatile memory, called flash memory, can electrically erase data in a plurality of memory cells collectively.

FIG. 1 shows a schematic configuration of conventional flash memory. Each cell contains a bit line BL and a word line WL. FIG. 1 shows just two BLs BL0 and BL1 and two WLs WL0 and WL1. Each intersection is provided with memory cell MC comprising nonvolatile transistor, namely an FETMOS-structured transistor having a floating gate. Bit lines BL0 and BL1 and word lines WL0 and WL1 in a plurality of cells and a plurality of memory cell MCs constitute a memory cell array.

Each memory cell in a memory cell array comprises a source, a drain, a floating gate, and a control gate. Drains for memory cell MCs arranged on the same column (Y-axis direction) are commonly connected to a bit line in each cell for the corresponding columns. Control gates for memory cell MCs arranged on the same row (X-axis direction) are commonly connected to a word line for the corresponding rows. Sources for memory cell MCs are commonly connected to a source line SL in a given unit.

An X decoder (row decoder) 101 selects one of a plurality of the word lines (row selection). A Y decoder (column decoder) 102 selects one of a plurality of the bit lines in each cell.

A read circuit 103 senses data by reading data stored in a cell selected by the X decoder 101 and the Y decoder 102. The read circuit 103 comprises a bit line BLL to which a cell-based bit line selected by Y decoder 102 is connected, a sense bit line BLS, a separation circuit 105, a bias circuit 107, a load circuit 109, a sense line SA, and an amplifier circuit 110. The separation circuit 105 comprises an N-channel separation transistor 104. The separation transistor 104 is connected between the bit line BLL and the sense bit line BLS and electrically separates between the sense bit line BLS and the bit line BLL. The bias circuit 107 comprises an N-channel bias transistor 106. The bias transistor 106 is connected between the sense bit line BLS and the sense line SA and optimizes voltages for memory cell MC's drains (the bit line BLL and the cell-based bit line BL) when data is read. The load circuit 109 uses a transistor 108 for a P-channel load which sets the sense line SA to a power supply voltage Vcc when data is read. During a sense period, the amplifier circuit 110 senses data by comparing a voltage generated on the sense line SA with a specified reference voltage VREF generated in a circuit (not shown).

The separation transistor 104's gate is supplied with a control signal PART. The bias transistor 106's gate is supplied with a bias voltage VBIAS which is lower than the power supply voltage Vcc.

The following describes a data read operation in the flash memory having the above-mentioned configuration with reference to a timing chart in FIG. 2. As shown in FIG. 2, data is read in three basic periods: an address selection period, a sense period, and an output period.

The address selection period takes effect from when an external address change is received until the word line and the cell-based bit line are selected in a memory cell array. During this period, it is necessary to stabilize a bias voltage VBIAS supplied to the bias transistor 106's gate. When the bias voltage VBIAS does not reach or exceeds a stable level during this period, the so-called soft-write effect occurs. By contrast, when the bias voltage VBIAS is lower than a stable level, bit line BLL charging delays. This is because the bias transistor 106 clamps the bit line BLL's voltage to a value which is lower than Vcc.

During the next sense period, the control signal PART turns on the separation transistor 104 and activates the amplifier circuit 110 at a timing when a memory cell is selected from the memory cell array. Before the separation transistor 104 turns on, a reset circuit (not shown) sets the bit line BLL to 0V. When the separation transistor 104 turn on, the bit line BLL becomes charged. Thereafter, a voltage VBLL of the bit line BLL varies with data stored for the selected memory cell. When the selected memory cell is set to "0", this memory cell does not turn on even if the word line is selected and is activated. The VBLL rises to a high voltage. By contrast, when the selected memory cell is set to "1", selecting the word line turns on this memory cell. The voltage VBLL lowers compared to the case where the data is set to "0".

When the amplifier circuit 110 is activated, a sense line SA voltage VSA is compared with the reference voltage VREF to sense data for the selected memory cell. At this time, the reference voltage VREF is approximately set to a middle between a bit line BLL voltage when data is read from the memory cell set to "1" and a bit line BLL voltage when data is read from the memory cell set to "0".

During the output period, data latched by the amplifier circuit 110 is sensed. This latched data is sent to an output circuit (not shown) and is output from an output pad (not shown).

As shown in FIG. 2, the bias voltage VBIAS stabilized after the address change temporarily drops when the sense period starts. The reason is described below.

FIG. 3 provides an enlarged view of changes in voltages VBLL and VSA for the bit line BLL and the sense line SA during the address selection period and the sense period with reference to a change of the bias voltage VBIAS in FIG. 2.

The bit line BLL voltage VBLL is set to 0V when the control signal PART is activated and the separation transistor 104 turns on. The bit line BLL voltage VBLL is first charged when the sense period starts and the separation transistor 104 turns on.

The sense line SA voltage VSA is stable with a given value (Vcc–Vthp) till the sense period, where Vthp is a threshold value of a P-channel MOS transistor. When the sense period starts, the sense line SA voltage VSA drastically drops. This is because turning on the separation transistor 104 charges a large capacity parasitically given to the bit line BLL. Accordingly, the sense line SA voltage VSA drops down to almost the same level as the bit line BLL voltage VBLL. The bias voltage VBIAS temporarily drops under the influence of this bit line voltage drop.

This is described in more detail with reference to equivalent circuit diagrams in FIGS. 4A through 4D. FIG. 4A shows each transistor state and each node voltage state at a final stage of the address selection period. The bit line BLL remains set and maintains its voltage VBLL to 0V. The sense line SA remains in an initial state and maintains its voltage VSA to (Vcc−Vthp). The bias voltage VBIAS already reaches a stable state. The load transistor 108 charges the sense bit line BLS approximately up to (VBIAS−Vth), where Vth is a threshold value of the bias transistor 106. At this time, the bias transistor 106's source voltage (VBLS) rises to (VBIAS−Vth) which turns off the bias transistor 106 itself. Accordingly, the bias transistor 106 remains off. Since the control signal PART is inactive, the separation transistor 104 is also off.

FIG. 4B shows each transistor state and each node voltage state when the sense period starts. When the control signal PART is activated and the separation transistor 104 turns on, an electric charge accumulated for the sense line SA and the sense bit line BLS is shared with a large capacity CBLL on the bit line BLL. At this time, the voltages VSA and VBLS for the sense line SA and the sense bit line BLS each drop down to almost 0V from the states in FIG. 4A. As shown in FIG. 4C, the bias voltage VBIAS decreases under the influence of coupling due to a gate-drain capacity Cgd and a gate-source capacity Cgs for the bias transistor 106. Consequently, the bias voltage VBIAS temporarily drops.

The bias transistor 106 is off in FIG. 4A, but turns on in FIG. 4B because the source voltage becomes 0V. The bias transistor 106 forms a channel and provides a large channel capacity for the gate. When the bias transistor 106 is on, it is assumed to be a large capacity as shown in FIG. 4D. The bias voltage VBIAS charges this capacity. Accordingly, turning on the bias transistor 106 and charging a channel capacity also causes the bias voltage VBIAS to drop.

If the bias voltage VBIAS cannot maintain a sufficiently high voltage during the sense period, the bit line BLL is charged too late, delaying the read time. In a worst case, a read error occurs.

If the once stabilized bias voltage VBIAS decreases, it needs to be increased to resume the stable state. An unnecessary current is consumed for a circuit which generates this bias voltage VBIAS.

In addition to FIG. 1, FIGS. 5, 6, and 7 show other schematic configurations of read circuits for the conventional flash memory.

The read circuit in FIG. 5 is void of the load circuit 109. Instead, the bias circuit 107 has a function equivalent to the load circuit 109. Such a read circuit is disclosed, say, in Japanese Patent Application No. 11-164183.

Also for the read circuit in FIG. 5, the sense bit line BLS is charged before the sense period. Thereafter, turning on the separation circuit 105 charge-shares with a large capacitance on the bit line BLL, causing the same problem as for the read circuit in FIG. 1.

The read circuit in FIG. 6 is void of the separation circuit 105. Instead, the Y decoder 102 has a function equivalent to the separation circuit 105. The separation circuit 105 is activated at a timing when the Y decoder 102 is activated. Consequently, the Y decoder 102 also functions like the separation circuit 105.

The read circuit in FIG. 6 also charges the bit line BLL before the sense period. Thereafter, turning on the Y decoder 102 charge-shares with a capacitance on the bit line BLL, causing the same problem as for the read circuit in FIG. 1. Basically, the cell-based bit line BL provides more capacitance than the bit line BLL. A smaller bit line BLL capacitance is charge-shared with a larger cell-based bit line BL capacitance due to column selection by the Y decoder 102.

The read circuit in FIG. 7 is void of the separation circuit 105 and the load circuit 109 in FIG. 1. Instead, the bias circuit 107 has a function equivalent to the load circuit 109 in FIG. 1. The Y decoder 102 has a function equivalent to the separation circuit 105 in FIG. 1.

Also regarding the read circuit in FIG. 7, the bias voltage VBIAS supplied to the bias circuit 107 temporarily drops when the sense period starts.

Conventionally, as mentioned above, the read circuit is provided with a bias circuit for preventing a soft-write effect by setting a memory cell's drain voltage to a value lower than a power supply voltage when data is read. The bias circuit is supplied with a bias voltage which temporarily drops at the beginning of the sense period. This voltage drop causes problems such as a delayed read time, a read error, and an increased current consumed.

BRIEF SUMMARY OF THE INVENTION

Accordingly, it is an object of the present invention to provide a nonvolatile semiconductor memory device and a control method thereof for preventing a delayed read time, a read error, and an increased current consumed by always stabilizing a bias voltage supplied to a bias circuit in a read circuit.

According to the present invention, there is provided a nonvolatile semiconductor memory device comprising: a memory cell array having cell-based bit lines and nonvolatile memory cells connected thereto, the nonvolatile memory cell is selected according to address signals in an address selection period; a bit line to which a signal voltage of the cell-based bit line is transmitted; a cell-based bit line decoder circuit for connecting the cell-based bit line in the memory cell array to the bit line in the address selection period according to the address signal; a sense bit line to which a signal voltage of the bit line is transmitted; a separation circuit connected between the sense bit line and the bit line, for electrically separating the sense bit line from the bit line; a sense line to which a signal voltage of the sense bit line is transmitted; a bias circuit connected between the sense line and the sense bit line, for supplying the sense bit line with a specified voltage; a load circuit connected to the sense line; an amplifier circuit supplied with a voltage of the sense line and a reference voltage, for amplifying a difference between both voltages; and a first initialization circuit activated according to a first control signal in the address selection period, for supplying the sense line with a specified voltage.

According to the present invention, there is provided a nonvolatile semiconductor memory device comprising: a memory cell array having cell-based bit lines and nonvolatile memory cells connected thereto, the nonvolatile memory cell is selected according to address signals in an address selection period; a bit line to which a signal voltage of the cell-based bit line is transmitted; a cell-based bit line decoder circuit for connecting the cell-based bit line in the memory cell array to the bit line in the address selection period according to the address signal; a sense bit line to which a signal voltage of the bit line is transmitted; a separation circuit connected between the sense bit line and the bit line, for electrically separating the sense bit line from the bit line; a sense line to which a signal voltage of the sense bit line is transmitted; a bias circuit connected between the sense line and the sense bit line, for supplying the sense bit line with a specified voltage; a load circuit connected to the sense line; an amplifier circuit supplied with a voltage of the sense line and a reference voltage, for amplifying a difference between both voltages; and a first initialization circuit activated according to a first control signal in the address selection period, for supplying the sense bit line with a specified voltage.

According to the present invention, there is provided a nonvolatile semiconductor memory device comprising: a memory cell array having cell-based bit lines and nonvolatile memory cells connected thereto, the nonvolatile memory cell is selected according to address signals in an address selection period; a bit line to which a signal voltage of the cell-based bit line is transmitted; a cell-based bit line decoder circuit for connecting the cell-based bit line in the memory cell array to the bit line in the address selection period according to the address signal; a sense line to which a signal voltage of the bit line is transmitted; a bias circuit connected between the sense line and the sense bit line, for supplying the sense bit line with a specified voltage; a load circuit connected to the sense line; an amplifier circuit supplied with a voltage of the sense line and a reference voltage, for amplifying a difference between both voltages; and a first initialization circuit activated according to a first control signal in the address selection period, for supplying the sense line with a specified voltage.

According to the present invention, there is provided a nonvolatile semiconductor memory device comprising: a memory cell array having cell-based bit lines and nonvolatile memory cells connected thereto, the nonvolatile memory cell is selected according to address signals in an address selection period; a bit line to which a signal voltage of the cell-based bit line is transmitted; a cell-based bit line decoder circuit for connecting the cell-based bit line in the memory cell array to the bit line in the address selection period according to the address signal; a sense line to which a signal voltage of the bit line is transmitted; a bias circuit connected between the sense line and the sense bit line, for supplying the sense bit line with a specified voltage; a load circuit connected to the sense line; an amplifier circuit supplied with a voltage of the sense line and a reference voltage, for amplifying a difference between both voltages; and a first initialization circuit activated according to a first control signal in the address selection period, for supplying the bit line with a specified voltage.

According to the present invention, there is provided a nonvolatile semiconductor memory device comprising: a memory cell array having cell-based bit lines and nonvolatile memory cells connected thereto, the nonvolatile memory cell is selected according to address signals during an address selection period; a bit line to which a signal voltage of the cell-based bit line is transmitted; a cell-based bit line decoder circuit for connecting the cell-based bit line in the memory cell array to the bit line in the address selection period according to the address signal; a bias circuit connected between a power supply node and the bit line, for supplying the bit line with a specified voltage according to a first control signal; an amplifier circuit supplied with a voltage of the bit line and a reference voltage, for amplifying a difference between both voltages; and a first initialization circuit activated according to a second control signal in the address selection period, for supplying the bit line with a specified voltage.

According to the present invention, there is provided a nonvolatile semiconductor memory device comprising: a bit line to which a read voltage is transmitted from a nonvolatile memory cell storing data; an amplifier circuit having a first and a second input nodes, respectively supplies these first and second input nodes with an input voltage corresponding to a read voltage on the bit line and a reference voltage, for amplifying a difference between both voltages; a bias circuit having a current path inserted between the bit line and the first input node of the amplifier circuit, for supplying a specified voltage to the first input node of the amplifier circuit; and an initialization circuit activated according to a first control signal in the address selection period, for supplying a specified voltage to at least one of both ends of the current path of the bias circuit.

According to the present invention, there is provided a method of controlling a nonvolatile semiconductor memory device in which a bias circuit is operated, thereby setting a data sense node to a prescribed potential in a data sense period, the voltage at the data sense node is changed in accordance with the data read from a memory cell, and an amplifier circuit compares the voltage with a reference voltage in the sense period, thereby sensing the data, the method comprising: setting the data sense node at the prescribed potential by an initialization circuit in the address selection period.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a system block diagram showing a configuration of the entire flash memory according to the first embodiment of the present invention;

FIG. 11 is a circuit diagram showing a read circuit in FIG. 9 together with a control circuit, the Y decoder, and an output circuit;

FIG. 12 is a circuit diagram showing an example of an internal configuration for an amplifier circuit in FIG. 11;

FIGS. 13A through 13C are circuit diagrams showing exemplary circuit configurations of a load element constituting a load circuit in FIG. 11;

FIG. 14 is a circuit diagram showing an exemplary configuration of a load switch circuit constituting the load circuit in FIG. 11 together with the load element;

FIG. 15 is a circuit diagram showing an exemplary configuration of a bias circuit in FIG. 11;

FIG. 16 is a circuit diagram showing an exemplary configuration of a bias voltage generation circuit in FIG. 11;

FIG. 17 is a circuit diagram showing an exemplary configuration of a bit line initialization circuit in FIG. 11;

FIG. 18 is a circuit diagram showing an exemplary configuration of a sense line initialization circuit in FIG. 11;

FIG. 19 is a circuit diagram showing an internal configuration of a separation circuit in FIG. 11;

FIGS. 22A and 22B are equivalent circuit diagrams for the flash memory corresponding to the first embodiment;

FIG. 25 is a circuit diagram showing part of a read circuit according to a fourth embodiment of the present invention;

FIG. 26 is a circuit diagram showing part of a read circuit according to a fifth embodiment of the present invention;

FIG. 34 is a circuit diagram showing part of a read circuit according to a twelfth embodiment of the present invention;

FIG. 35 is a circuit diagram showing part of a read circuit according to a thirteenth embodiment of the present invention;

FIG. 36 shows another exemplary configuration of a memory cell unit in the memory cell array in FIG. 9; and FIG. 37 shows yet another exemplary configuration of a memory cell unit in the memory cell array in FIG. 9.

DETAILED DESCRIPTION OF THE INVENTION

The following describes the first embodiment of the present invention which applies a semiconductor memory according to the present invention to flash memory.

Figure 8:
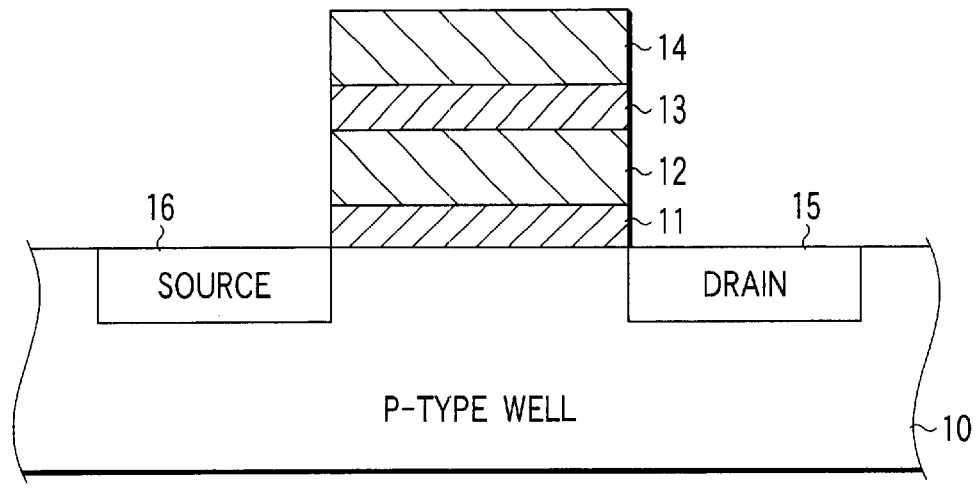
FIG. 8 is a sectional view of a nonvolatile transistor uses as a memory cell for the flash memory according to a first embodiment of the present invention.

A flash memory uses the so-called stack-gate nonvolatile transistor (FETMOS transistor having a floating gate) as a memory cell. In FIG. 8, a gate insulation film 11 is provided on the surface of a P-type well 10. A floating gate 12 comprising polycrystal silicon is provided on the gate insulation film 11. An insulation film 13 is provided thereon. A control gate 14 is further provided thereon. On the surface of the P-type well 10 not covered by the floating gate 12 and the control gate 14, there are formed a drain 15 and a source 16 in which N-type impurities are implanted.

The following summarizes operations of this type of the memory cell.

When writing to the memory cell for storing data, a positive voltage, say, +6V is applied to the drain 15. A ground voltage of 0V is applied to the P-type well 10 and the source 16 each. Further, a high positive voltage, say, approximately +10V is applied to the control gate 14. The floating gate 12 is not connected to an external power supply. To determine a voltage of the floating gate 12, a coupling ratio is found between a capacitance comprising the control gate 14, the insulation film 13, and the floating gate 12, and a capacitance comprising the floating gate 12, the gate insulation film 11, and the P-type well 10. According to the coupling ratio, the floating gate 12's voltage is uniquely determined from voltages of the control gate 14, the drain 15, the source 16, and the P-type well 10.

Setting each node of the nonvolatile transistor to such a voltage generates hot electrons having high energy in a transverse electric field (source-drain direction). Part of hot electrons passes the gate insulation film 11's barrier and is injected into the floating gate 12, thus writing data to the memory cell.

As mentioned above, erasing the memory cell (erasing data) means writing to the memory cell and eliminating electrons from the floating gate 12 of the memory cell in which electrons are accumulated. For example, data is erased as follows.

A positive high voltage, say, +10V is applied to the P-type well 10 and the source 16. A negative voltage, say, −7V is applied to the control gate 14. As a result, a considerably strong electric field, say, 10 MV/cm or more is applied to the gate insulation film 11 between the P-type well 10 and the floating gate 12 or between the source 16 and the floating gate 12. Under such a strong electric field, a quantum-mechanical Fowler-Noldheim current (tunnel current) flows in the gate insulation film 11. Using this result, electrons are eliminated from the floating gate 12 to the P-type well 10 or to the source 16, thus erasing the memory cell.

Reading a memory cell (reading data) uses different voltages for floating gates in the memory cells written or erased in the above-mentioned manner.

More specifically, when an N-type reverse channel is to be formed under the memory cell's floating gate, the floating gate 12 accumulates electrons in a written memory cell. Forming a channel in the written memory cell needs to positively charge the floating gate more strongly than forming a channel in an erased memory cell (no electrons accumulated). As mentioned above, to determine a voltage of the floating gate 12, a coupling ratio is found between a capacitance comprising the control gate 14, the insulation film 13, and the floating gate 12, and a capacitance comprising the floating gate 12, the gate insulation film 11, and the P-type well 10. According to the coupling ratio, the floating gate 12's voltage is uniquely determined from voltages of the control gate 14, the source 16, the drain 15, and the P-type well 10. Accordingly, it is possible to control a control gate 14's voltage with reference to the written memory cell and the erased memory cell so that the written memory cell forms no channel and the erased memory cell forms a channel. At this time, the control gate 14's voltage is assumed to be VREAD. When the control gate 14's voltage is set to VREAD with an appropriate potential provided between the drain and the source, nothing occurs in the written memory cell (hereafter referred to as the off-cell) because it forms no channel. By contrast, the erased memory cell (hereafter referred to as the on-cell) forms a channel to flow a current determined by a potential between the drain and the source and a floating gate voltage like an ordinary N-channel MOS transistor.

When the control gate 14 is supplied with the voltage VREAD, the read circuit (described later) reads memory cell information by determining whether or not a current flows between the source and the drain.

The following describes a configuration of the entire flash memory according to the first embodiment of the present invention with reference to a system block diagram in FIG. 9. The flash memory according to this embodiment comprises an input circuit 21, a control circuit 22, a memory cell array 23, a booster circuit 24, an X decoder (row decoder) 25, a Y decoder (column decoder) 26, a source-well decoder 27, a write circuit 28, a read circuit 29, and an output circuit 30. The input circuit 21 inputs addresses and various control signals for selecting memory cells. The control circuit 22 decodes a signal input from the input circuit 21 and outputs a control signal to each circuit. The memory cell array 23 is provided with a plurality of word lines and cell-based bit lines and comprises memory cells as shown in FIG. 8 for as many as m rows by n columns. The booster circuit 24 generates a high voltage for writing, erasing, and reading memory cells in the memory cell array 23. The X decoder 25 selectively drives a plurality of word lines in the memory cell array 23. The Y decoder 26 selects a cell-based bit line (column). The source-well decoder 27 is supplied with a high voltage generated from the booster circuit 24. The source-well decoder 27 generates a voltage to be supplied to the memory cell array 23, specifically to the P-type well where a plurality of memory cells is formed and to the source line to which memory cell sources are commonly connected in specified units. The write circuit 28 controls write and verify operations. The read circuit 29 determines a memory cell state during a read operation. The output circuit 30 outputs read data.

Figure 10:
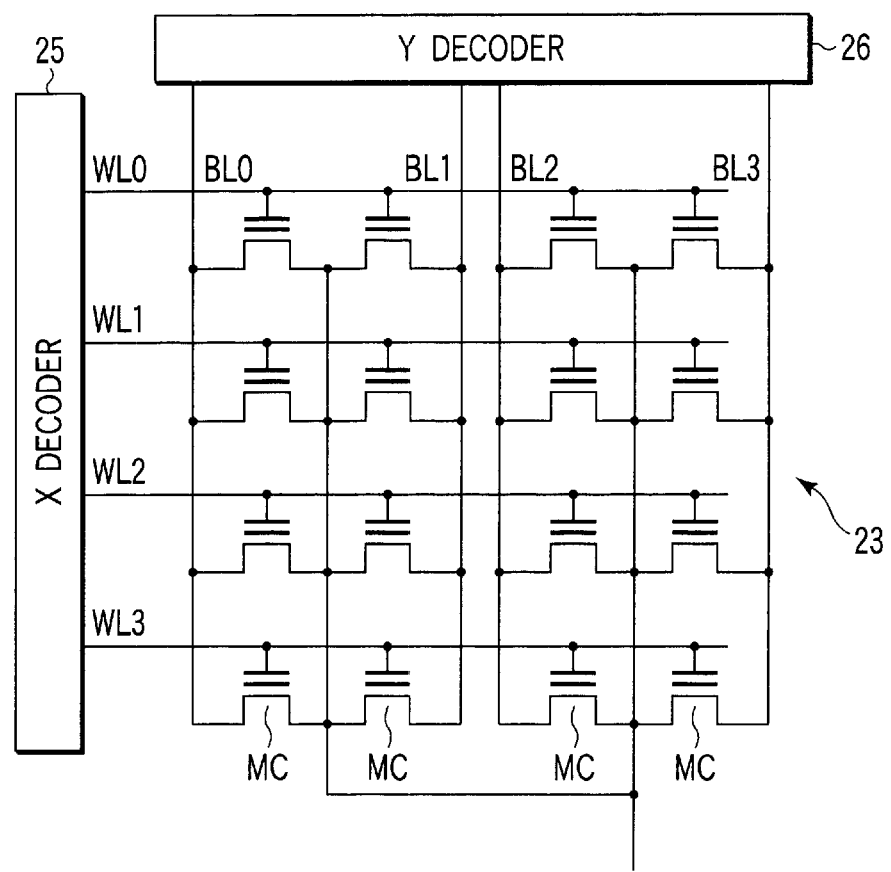
FIG. 10 is a circuit diagram showing a memory cell array in FIG. 9 together with an X decoder and a Y decoder.

FIG. 10 shows a configuration of the memory cell array 23 in FIG. 9 together with the X decoder 25 and the Y decoder 26.

The memory cell array 23 includes memory cells MC as many as can be processed in a single collective erase operation. Specifically, m rows×n columns of memory cells MC in a matrix are provided in a same P-type well, where m and n are 2 or larger natural numbers. FIG. 10 assumes m=n=4 for simplicity of explanation.

Respective control gates for memory cells MC placed on the same row are commonly connected to the corresponding word line WL0 through WL3. Respective drains for memory cells MC placed on the same column are commonly connected to the corresponding bit line BL0 through BL3. The P-type well (shown in FIG. 8) of each memory cell MC is commonly connected in the memory cell array 23. The source for each memory cell MC is commonly connected to the source line SL.

To write or read a given bit (one memory cell), the X decoder 25 selects word line WL1 (i=0 through 3) and the Y decoder 26 selects cell-based bit line BLj (j=0 through 3).

An erase operation is collectively applied to m-by-n memory cells in the memory cell array 23 in which P-type well is used commonly.

FIG. 11 shows an internal configuration of the read circuit 29 in FIG. 9 together with the control circuit 22, the Y decoder 26, and the output circuit 30.

The read circuit 29 comprises a bit line BLL, a sense bit line BLS, a sense line SA, a separation circuit 41, a bias circuit 42, a load circuit 43, an amplifier circuit 44, a reference voltage generation circuit 45, a bit line initialization circuit 46, a sense line initialization circuit 47, a bias voltage generation circuit 48, and a timing pulse generation circuit 49. The separation circuit 41 is connected between the bit line BLL and the sense bit line BLS, and separates the bit line BLL from the sense bit line BLS regarding voltages. The bias circuit 42 is connected between the sense bit line BLS and the sense line SA. Receiving a given bias voltage VBIAS, the bias circuit 42 sets a voltage for the sense bit line BLS independently of a sense line SA's voltage. The load circuit 43 is connected to the sense line SA. The amplifier circuit 44 amplifies a voltage amplitude on the bit line BLL for sensing and outputting data in a selected memory cell. The reference voltage generation circuit 45 generates a reference voltage VREF used for sensing data by the amplifier circuit 44. The bit line initialization circuit 46 is connected to the bit line BLL and sets it at a specified timing. The sense line initialization circuit 47 is connected to the sense line SA and sets it at a specified timing. The bias voltage generation circuit 48 generates a bias voltage VBIAS. Based on a control signal generated in the control circuit 22 when an address changes, for example, the timing pulse generation circuit 49 generates various timing pulses such as VTIMEpart, VTIMEload, VTIMEblreset, VTIMEsareset, VTIMEbias, and the like for controlling operations of the separation circuit 41, the load circuit 43, the amplifier circuit 44, the bit line initialization circuit 46, the sense line initialization circuit 47, and the bias voltage generation circuit 48.

The load circuit 43 comprises a load element 43a and a load switch circuit 43b. One end of the load element 43a is connected to the sense line SA. The load switch circuit 43b is connected to the other end of the load element 43a and is continuity-controlled on the basis of the timing pulse VTIMEload.

FIG. 12 exemplifies an internal configuration of the amplifier circuit 44 in FIG. 11.

A function of the amplifier circuit 44 is to amplify a potential between a sense line SA's voltage VSA and the reference voltage VREF, and determine data read from a selected memory cell. The amplifier circuit 44 comprises a differential amplifier 44a and a data latch circuit 44b. One input node of the differential amplifier 44a is supplied with a sense line SA's voltage VSA. The other input node thereof is supplied with the reference voltage VREF. The differential amplifier 44a is activated and controlled by a timing pulse VTIMEamp generated from the timing pulse generation circuit 49 in FIG. 11. When activated, the differential amplifier 44a amplifies a difference between both voltages to determine data. The data latch circuit 44b is activated and controlled by a timing pulse VTIMElatch generated from the timing pulse generation circuit 49 in FIG. 11. When activated, the data latch circuit 44b latches and outputs data determined by the differential amplifier 44.

FIGS. 13A through 13C exemplify various circuit configurations of the load element 43a constituting the load circuit 43 in FIG. 11.

The load element 43a in FIG. 13A comprises a resistor element 51. One end of the resistor element 51 is connected to the sense line SA. The other end thereof is connected to the load switch circuit 43b.

The load element 43a in FIG. 13B is of active load type. A gate of a P-channel MOS transistor 52 is connected to a 0V ground voltage. A drain is connected to the sense line SA. A source is connected to the load switch circuit 43b. The transistor 52's substrate (backgate) may be set to the same voltage as the power supply voltage (Vcc).

The load element 43a in FIG. 13C is also of active load type and comprises a P-channel MOS transistor 53 connected at a diode. A drain and a gate are both connected to the sense line SA. A source is connected to the load switch circuit 43b. Also in this case, the transistor 53's substrate (backgate) may be set to the same voltage as the power supply voltage (Vcc).

FIG. 14 exemplifies a configuration of the load switch circuit 43b constituting the load circuit 43 in FIG. 11 together with the load element 43a. The load switch circuit 43b comprises, say, a P-channel MOS transistor 54. A source of the transistor 54 is connected to a node supplying the power supply voltage Vcc. A drain of the transistor 54 is connected to the load element 43a. A gate of the transistor 54 is supplied with /VTIMEload which is a reverse signal of the timing pulse VTIMEload.

FIG. 15 exemplifies a configuration of the bias circuit 42 in FIG. 11. A function of the bias circuit 42 is to provide the memory cell MC's drain with an optimal voltage during reading. During a read operation, the memory cell gate is supplied with, say, a voltage of +5V (VG=+5V). The drain is supplied with a positive voltage which is lower than Vcc. The source and the substrate are both set to 0V. That is, read biases applied are same as write biases applied: +10V for a gate voltage and +6V for a source voltage. Applying a positive voltage to the drain of a reading memory cell causes a soft-write effect which is a slight write operation occurring even in a read operation. A drain voltage during reading must be as low as possible (1V at most) so as to prevent a pentode operation in memory cells.

Accordingly, the bias circuit 42 needs to control a bit line BLL voltage so that it will not exceed 1V.

As shown in FIG. 15, the bias circuit 42 comprises an N-channel MOS transistor 55. Its gate is supplied with a specified bias voltage VBIAS generated from the bias voltage generation circuit 48.

To keep the bit line BLL to 1V or lower, a bias voltage VBIAS value is set to the bit line BLL voltage VBLL (1V) to be set plus a threshold value of the N-channel MOS transistor 55.

FIG. 16 exemplifies a configuration of the bias voltage generation circuit 48 in FIG. 11 for generating such a bias voltage VBIAS. This circuit is called the Wilson type. The circuit comprises two P-channel MOS transistors 61 and 62, three N-channel MOS transistors 63 through 65, and a bias switch circuit 66.

With respect to two P-channel MOS transistors 61 and 62, sources are connected to each other, and gates are connected to each other. The transistor 61's drain is connected to a gate common connection node for the transistors 61 and 62. These transistors 61 and 62 constitute a P-channel current mirror circuit. Gates of the N-channel MOS transistors 63 and 64 are connected to each other. The transistor 64's drain is connected to a gate common connection node for the transistors 63 and 64. These transistors 63 and 64 constitute an N-channel current mirror circuit. The transistor 63's source is connected to a ground voltage node. The transistor 63's source is connected to the ground voltage node through the drain-source of the N-channel MOS transistor 65. The transistor 65's gate is connected to its drain.

The bias switch circuit 66 is connected between a source common connection node for the P-channel MOS transistors 61 and 62 and the power supply voltage vcc supply node. The bias switch circuit 66 is continuity-controlled by the timing pulse VTIMEbias generated from the timing pulse generation circuit 49 in FIG. 11.

In the bias voltage generation circuit 48 having the above-mentioned configuration, the timing pulse VTIMEbias is activated to turn on the bias switch circuit 66. At this time, an almost constant bias voltage VBIAS is output from the common drain for the transistors 62 and 64 independently of a change in the power supply voltage Vcc.

FIG. 17 exemplifies a configuration of the bit line initialization circuit 46 in FIG. 11. The bit line initialization circuit 46 comprises an N-channel MOS transistor 71. A source of the transistor 71 is connected to the ground voltage (0V). A drain thereof is connected to the bit line BLL. A gate is supplied with the timing pulse VTIMEblreset generated from the timing pulse generation circuit 49 in FIG. 11.

A function of the bit line initialization circuit 46 is reset the bit line BLL's voltage VBLL to 0V when a read operation terminates.

An initial value for the bit line BLL's voltage VBLL during a subsequent read operation depends on whether an on-cell or an off-cell was read during a previous read operation. Unless the bit line BLL is set to a specified voltage, reading an off-cell starts the subsequent read operation from a high voltage. Reading an on-cell starts the subsequent read operation from a low voltage. This requires two settings for a read operation, making operations very difficult. Accordingly, a data read operation is made easy by the fact that the bit line initialization circuit 46 sets the bit line BLL to 0V independent of how the previous data is read.

Like the bit line initialization circuit 46, the sense line initialization circuit 47 in FIG. 11 comprises an N-channel MOS transistor 72 as shown in FIG. 18. In this case, however, the transistor 72's drain is connected to the sense line SA. The gate is supplied with the timing pulse VTIMEsareset generated from the timing pulse generation circuit 49 in FIG. 11.

FIG. 19 shows an internal configuration of the separation circuit 41 in FIG. 11. A function of the separation circuit 41 is to electrically separate the sense bit line BLS from the bit line BLL.

The load circuit 43 needs to be separated from the bit line BLL for allowing the bit line initialization circuit 46 to set a bit line BLL voltage. If the bit line initialization circuit 46 operates to set a bit line BLL voltage with the load circuit 43 connected, an electric current flows from the load circuit 43 through the bit line initialization circuit 46, consuming an unnecessary current. The separation circuit 41 is provided for preventing an unnecessary current from flowing.

The separation circuit 41 comprises an N-channel MOS transistor 73 for separation and a level shifter 74. A source of the transistor 73 is connected to the sense bit line BLS. A drain of the transistor 73 is connected to the bit line BLL. A gate of the transistor 73 is supplied with the control signal PART. The level shifter 74 receives a high voltage Vp generated from the booster circuit 24 in FIG. 9 and the timing pulse VTIMEpart generated from the timing pulse generation circuit 49 in FIG. 11. The level shifter 74 then shifts a high-level voltage in the timing pulse VTIMEpart to the high voltage Vp and outputs the control signal PART.

Incidentally, the control signal PART shifted to the high voltage Vp controls the separation transistor 73's gate. This is because of keeping continuity resistance for turning on the transistor 73 as low as possible.

Figure 20:
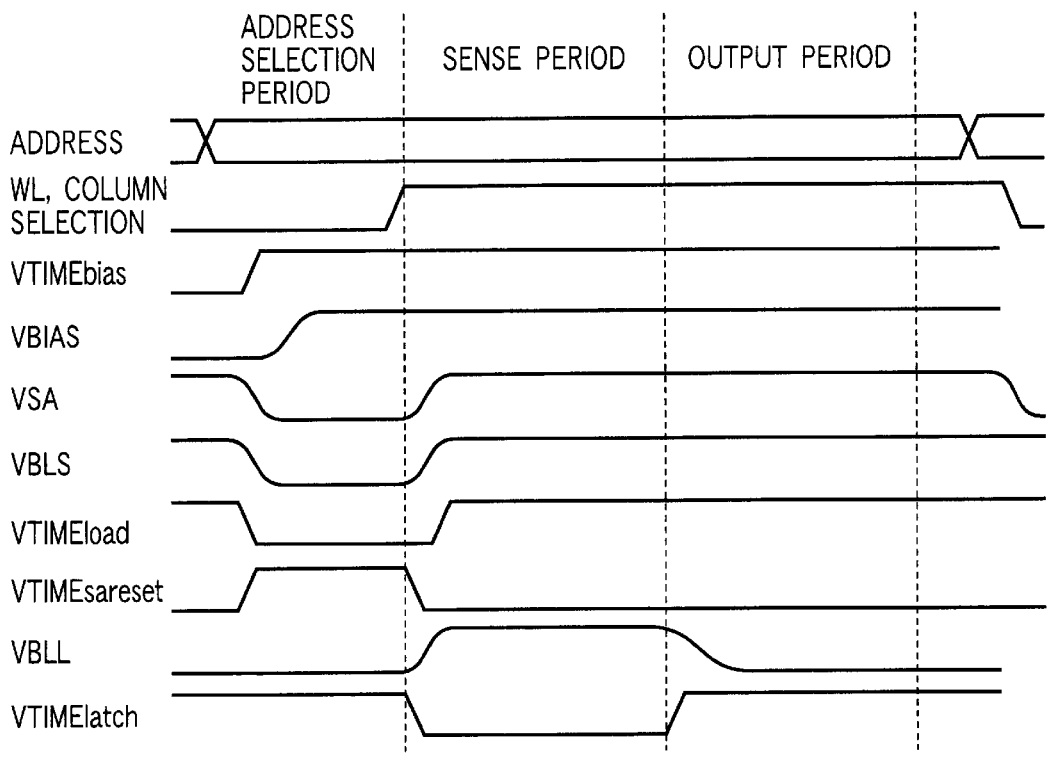
FIG. 20 is a timing chart of a read operation for data in the flash memory according to the first embodiment.

The following describes a data read operation in the flash memory having the above-mentioned configuration with reference to a timing chart in FIG. 20. A data read period basically comprises an address selection period, a sense period, and an output period.

The address selection period takes effect from when an external address change is received until the word line and the cell-based bit line are selected in a memory cell array. In this address selection period, the timing pulse VTIMEblreset (not shown in FIG. 20) is preset to an H level. The transistor 71 in the bit line initialization circuit 46 is turned on. Accordingly, a bit line BLL voltage is set to 0V. The timing pulse VTIMEload is also set to an H level. Its reverse signal, /VTIMEload, is set to an L level. In the load circuit 43, the P-channel MOS transistor 54 in FIG. 14 constituting load switch circuit 43b turns on. The sense line SA is charged via the load element 43a. The corresponding voltage VSA is stabilized to (Vcc−Vthp), where Vthp is a threshold value of the P-channel MOS transistor.

When an external address changes, the timing pulse VTIMEbias is first activated. Activating the timing pulse VTIMEbias turns on a bias switch circuit 66 in the bias voltage generation circuit 48 in FIG. 16. Consequently, the bias voltage generation circuit 48 starts generating the bias voltage VBIAS which is later stabilized to a specified voltage.

Almost concurrently with activation of the timing pulse VTIMEbias, the timing pulse VTIMEsareset is activated. Activating the VTIMEsareset turns on a transistor 71 in the bit line initialization circuit 46 in FIG. 17. A sense line SA's voltage VSA is charged to (Vcc−Vthp) so far. It then lowers to 0V.

Further, in response to an external address change, the timing pulse VTIMEload goes to the L level. Its reverse signal /VTIMEload goes to the H level. In the load circuit 43 as shown in FIG. 14, the P-channel MOS transistor 54 is turned on so far. When the /VTIMEload goes to the H level, the P-channel MOS transistor 54 goes off to terminate sense line SA charging by the load circuit 43. For preventing a short-circuit current, it is. desirable to set the timing for the timing pulse VTIMEload to go to the L level at almost the same time as or slightly earlier than the timing when the previous timing pulse VTIMEsareset goes to the H level.

Figure 1:
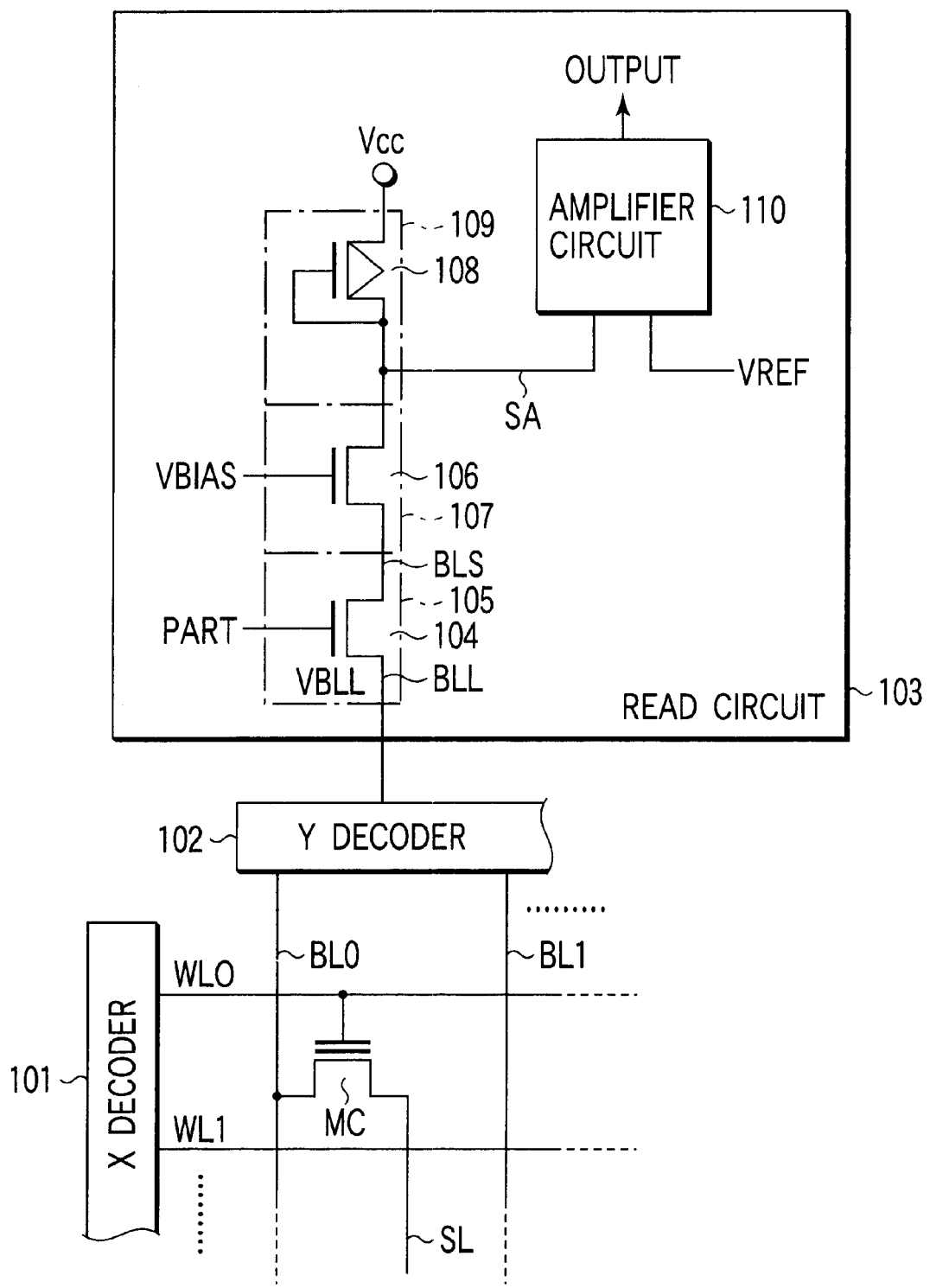
FIG. 1 shows a schematic configuration of conventional flash memory.
Figure 2:
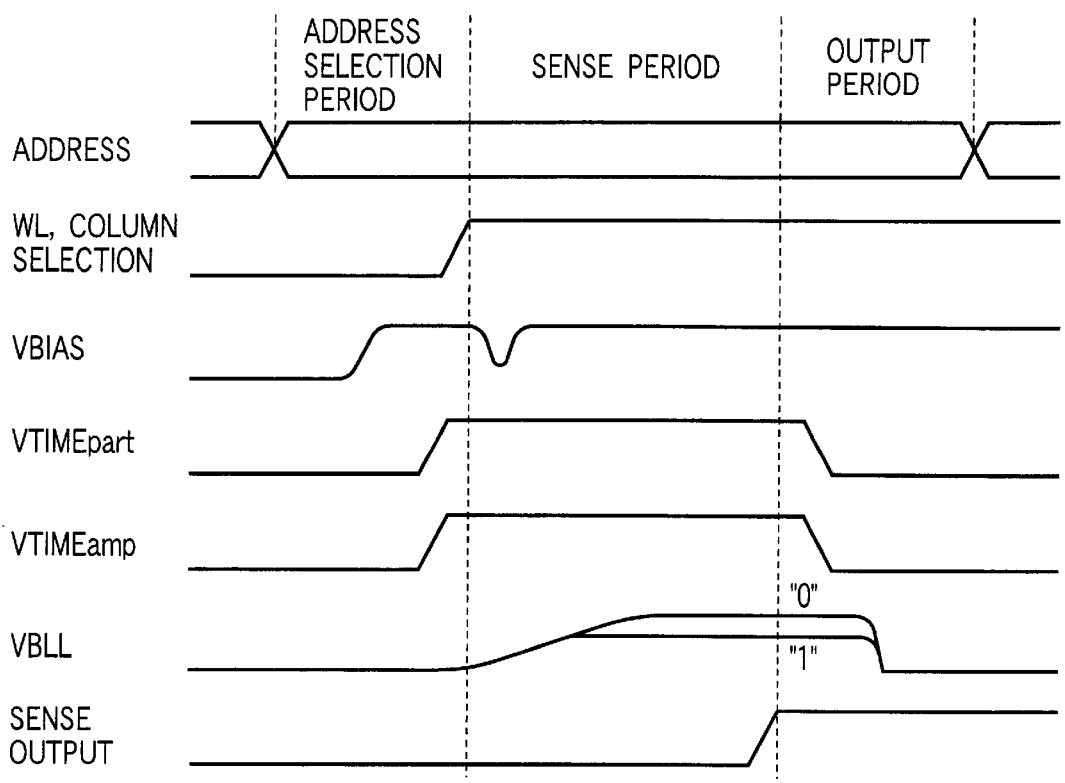
FIG. 2 is a timing chart of a read operation for data in the conventional flash memory as shown in FIG. 1.
Figure 3:
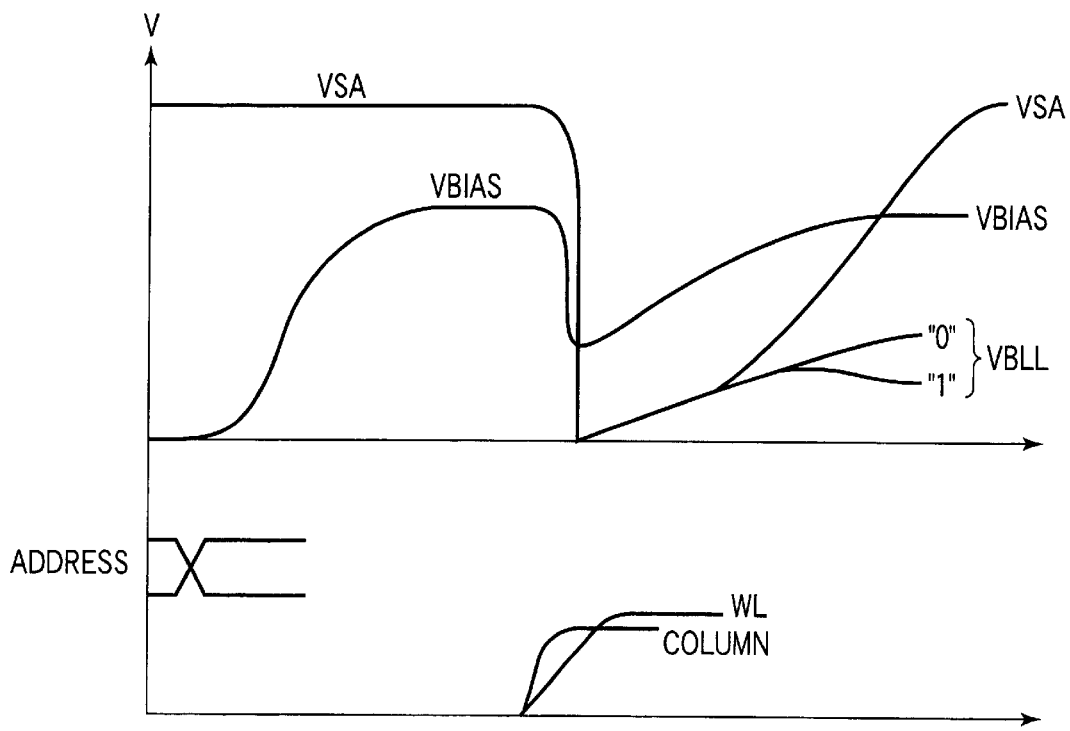
FIG. 3 shows enlarged waveforms for some voltage changes in the timing chart in FIG. 2.
Figures 4A, 4B, 4C, 4D:
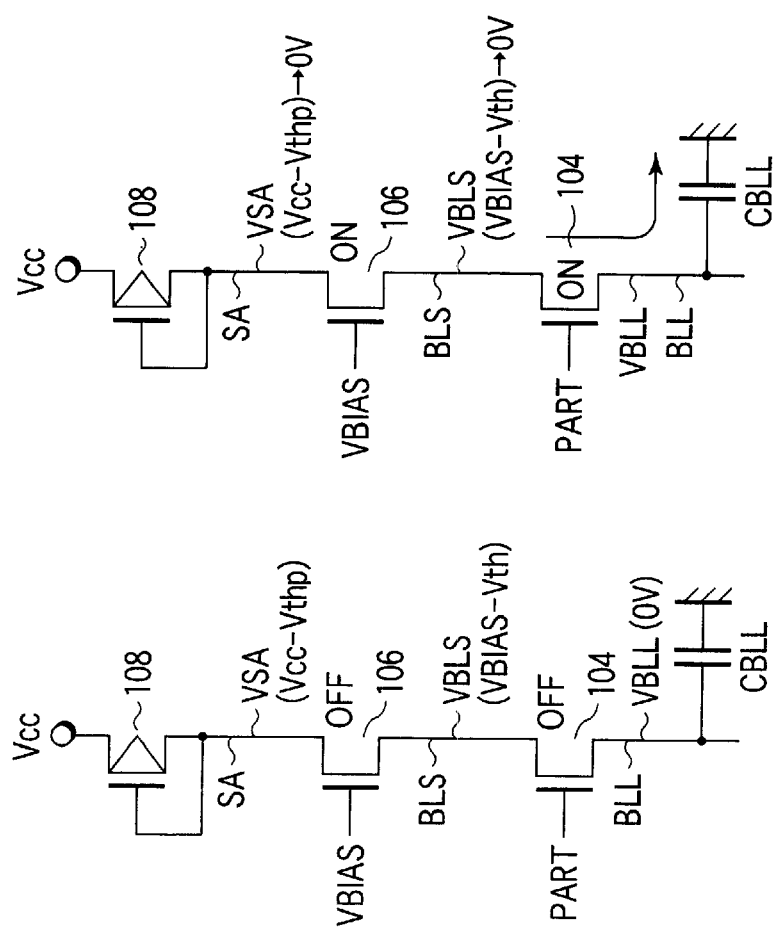
FIGS. 4A through 4D are equivalent circuit diagrams for the conventional flash memory in FIG. 1.

During this address selection period, the timing pulse VTIMEpart keeps the L level similarly to the timing chart in FIG. 2. In the separation circuit 41 in FIG. 19, the level shifter 74 outputs the L-level control signal PART. The transistor 73 is turned off. The bit line BLL and the sense bit line BLS are electrically separated.

Then, in the sense period, the timing pulse VTIMEblreset goes to the L level. The transistor 71 in the bit line initialization circuit 46 goes off to release the voltage setting of the bit line BLL. Based on an address at this time, the word line and the cell-based bit line are selected. The selected cell-based bit line BL is connected to the bit line BLL via the Y decoder 26. The timing pulse VTIMEpart goes to the H level. As shown in FIG. 19, the transistor 73 in the separation circuit 41 goes on to electrically connect the bit line BLL with the sense bit line BLS.

Also in the sense period, the timing pulse VTIMEsareset becomes inactive to release the voltage setting of the sense line SA by means of the sense line initialization circuit 47. The timing pulse VTIME load is also inactivated. When the timing pulse VTIMEload becomes inactive, the load circuit 43 re-charges the sense line SA. In this state, the bit line BLL's voltage VBLL changes corresponding to data stored in the selected memory cell. A voltage change on this bit line BLL is transmitted to the sense line SA via the sense bit line BLS. The timing chart in FIG. 20 assumes that an off-cell is selected.

In the sense period, the amplifier circuit 44 compares a sense line SA's voltage VSA with the reference voltage VREF to sense data. During the output period to follow, the timing pulse VTIMElatch is activated. Then, the data latch circuit 44b latches data sensed by the differential amplifier 44a of the amplifier circuit 44 in FIG. 12. Thereafter, the latched data is output from an output pad via the output circuit 30.

Just before the sense period, the bit line initialization circuit 46 sets the bit line BLL to 0V. The sense bit line BLS is also set to 0V via the bias circuit 42. Once the bias voltage VBIAS reaches a stable level, it does not drop. The reason is described later.

Figure 21:
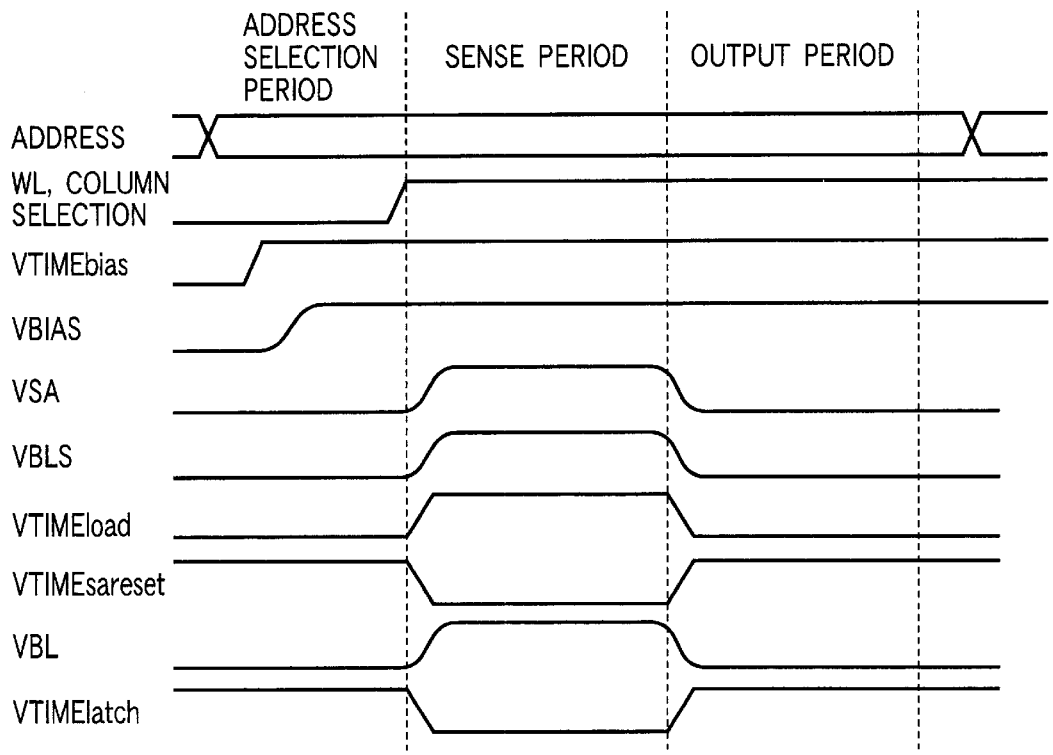
FIG. 21 is another timing chart different from FIG. 20 for the flash memory according to the first embodiment.

FIG. 21 shows a timing chart of a read operation for reading data which differs from that in FIG. 20. In this case, a timing to set an initial voltage for the sense line SA is synchronized with a timing to set an initial voltage for the bit line BLL. At the timing when the bit line BLL's initial voltage setting is released, the sense line SA's initial voltage setting is released and the load circuit 43 is activated. At the timing when the bit line BLL is set, the sense line SA's initial voltage is set and the load circuit 43 is inactivated.

Like the case in FIG. 20, the sense line SA and the sense bit line BLS are both initialized to 0V just before the sense period.

As mentioned above, the bias voltage VBIAS does not drop when the sense line SA and the sense bit line BL3 are initialized to 0V before the sense period. The reason is described below in detail with reference to equivalent circuit diagrams in FIGS. 22A and 22B which show enlarged portions of the read circuit 29 in FIG. 11. In this case, as shown in FIG. 13C, a load element 43b in the load circuit 43 comprises the P-channel MOS transistor 53 connected with the gate and the drain.

FIG. 22A shows each transistor state and each node voltage state at a final stage of the address selection period.

At the final stage of the address selection period, the transistor 72 of the sense line initialization circuit 47 turns on to initialize the sense line SA and the sense bit line BLS. The corresponding voltages VSA and VBLS are both set to 0V. Because the source is 0V, the transistor 55 in the bias circuit 42 is turned on to form a channel. When the transistor 72 turns on and the sense line SA and the sense bit line BLS are initialized to reset the corresponding voltages VSA and VBLS to 0V, the bias voltage VBIAS temporarily drops due to a capacitance between the gate and the source and a capacitance between the gate and the drain in the transistor 72. However, no effect occurs before the sense period. The temporarily dropped bias voltage VBIAS value is restored to the original voltage during the address selection period.

FIG. 22B shows each transistor state and each node voltage state in the sense period. When the sense period starts, the transistor 72 goes off. Initialization of the sense line SA and the sense bit line BLS is released. The sense line SA and the sense bit line BLS start to be charged. Just after the charging, the sense line SA and the sense bit line BLS maintain the same voltage (0V) as the bit line BLL which is initialized by the bit line initialization circuit 46 in advance.

Even if the control signal PART is activated to turn on the separation transistor 73, voltages of the sense line SA and the sense bit line BLS do not drop.

Conventionally, an electric charge is accumulated on the sense line SA and the sense bit line BLS. When the sense period starts, this electric charge is charge-shared with a large capacitance CBLL on the bit line BLL to drastically drop voltages VSA and VBLS for the sense line SA and the sense bit line BLS. This embodiment does not cause such a problem. Consequently, the bias voltage VBIAS does not drop due to capacitance coupling between the gate and the source and between the gate and the drain of the bias transistor 55 in the bias circuit 42.

As an unfavorable effect when the sense period starts, it may be considered that source and drain voltages of the bias transistor 55 rise from 0V to increase the bias voltage VBIAS. Unlike the prior art, however, the voltage VSA does not rise so drastically as to drop the sense line SA's voltage VSA. It is possible to solve the problem by increasing element sizes of transistors constituting the bias voltage generation circuit 48 in FIG. 16.

Conventionally, the bias transistor goes off in the address selection period and goes on in the sense period to increase the gate capacitance. This is a cause of fluctuating the bias voltage VBIAS. By contrast, according to this embodiment, the bias transistor 55 is already turned on in the address selection period. If the separation circuit 41 (transistor 73) is turned on, the transistor 55's gate capacitance is almost unchanged.

The flash memory according to this embodiment can maintain a constant bias voltage supplied to the bias circuit in the read circuit, thus preventing a read delay or a read error. Once the bias voltage VBIAS is stabilized, it remains unchanged. Unlike the prior art, it is unnecessary to re-increase a dropped voltage, thus saving electric currents consumed in the bias voltage generation circuit 48.

Figure 23:
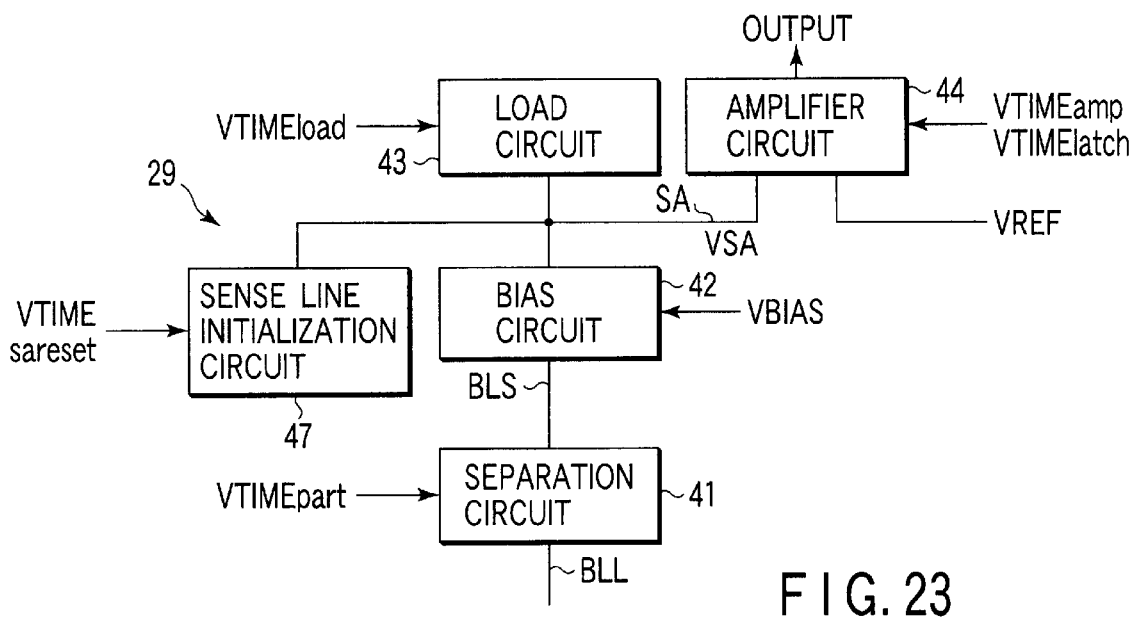
FIG. 23 is a circuit diagram showing part of a read circuit according to a second embodiment of the present invention.
Figure 24:
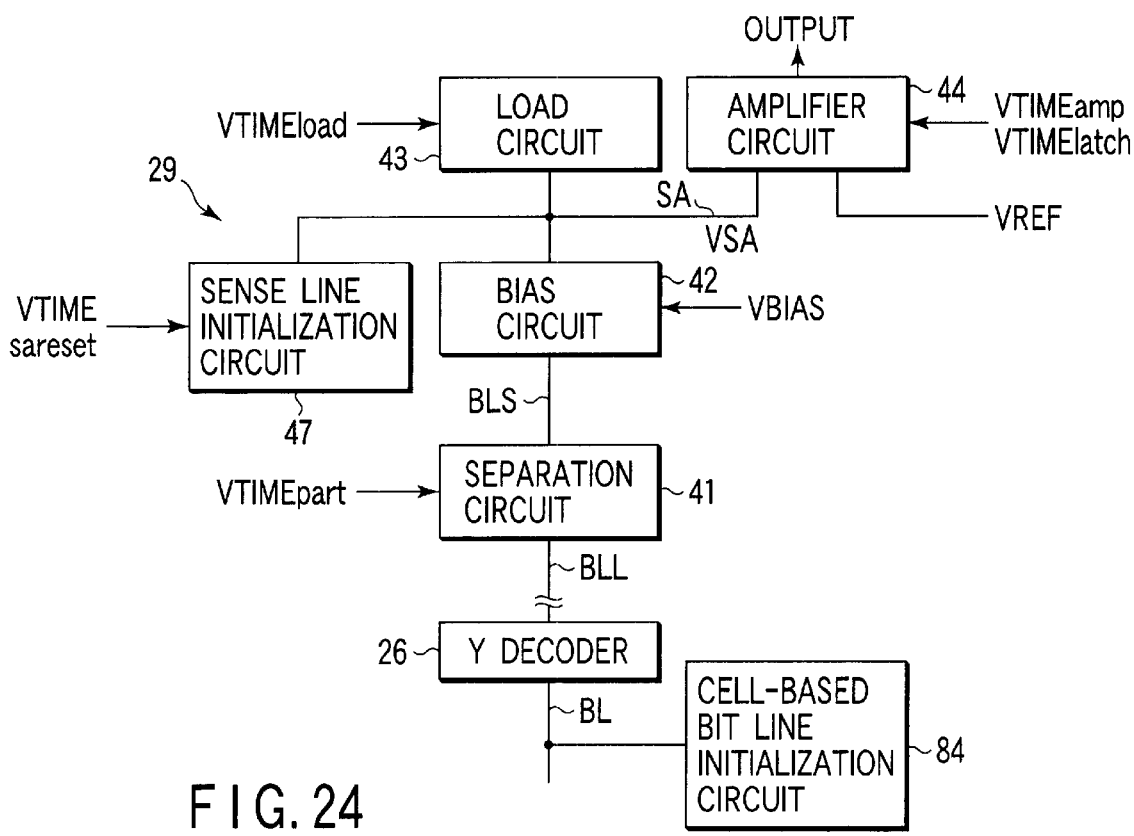
FIG. 24 is a circuit diagram showing part of a read circuit according to a third embodiment of the present invention.

The above-mentioned embodiment of the present invention has been described with respect to initializing the bit line BLL by providing the bit line initialization circuit 46 in addition to the sense line initialization circuit 47. Like a second embodiment as shown in FIG. 23, there may be provided only the sense line initialization circuit 47. Further, like a third embodiment as shown in FIG. 24, there may be provided a cell-based bit line initialization circuit 84 for initializing the cell-based bit line BL instead of the bit line initialization circuit 46. The circuit may be modified so that the cell-based bit line BL is initialized at the same timing as the bit line initialization circuit 46.

In each of the above-mentioned embodiments, each initialization circuit may be initialized to 0V or any other voltage.

FIG. 25 partially shows the configuration of the read circuit 29 according to the fourth embodiment of the present invention. This embodiment omits illustrations and corresponding descriptions with respect to portions equivalent to those in the read circuit 29 according to the second embodiment in FIG. 23.

The read circuit 29 according to this embodiment differs from the equivalent circuit in FIG. 23 in that a sense bit line initialization circuit 81 is provided for initializing the sense bit line BLS instead of the sense line initialization circuit 47.

The sense bit line initialization circuit 81 comprise an N-channel MOS transistor in which, for example, the drain is connected to the sense bit line BLS; the source is connected to the ground voltage; and the gate is supplied with the timing pulse VTIMEblsreset.

The timing pulse VTIMEblsreset can be generated from the timing pulse generation circuit 49 in FIG. 11 together with other pulses. The activation or inactivation timing may be same as for the timing pulse VTIMEsalreset.

This embodiment also provides the same effect as when the sense line initialization circuit 47 is provided.

Also in this case, the sense line initialization circuit 47 can set an initial voltage to 0V or any other voltage.

FIG. 26 partially shows the configuration of the read circuit 29 according to the fifth embodiment of the present invention. This embodiment omits illustrations and corresponding descriptions with respect to portions equivalent to those in the read circuit 29 according to the first embodiment in FIG. 11.

The read circuit 29 according to this embodiment differs from the equivalent circuit in FIG. 11 in that a sense bit line initialization circuit 81 is provided instead of the bit line initialization circuit 46.

This embodiment also provides the same effect as in FIG. 11.

Also in this case, the sense line initialization circuit 81 set an initial voltage to 0V or any other voltage.

Figure 27:
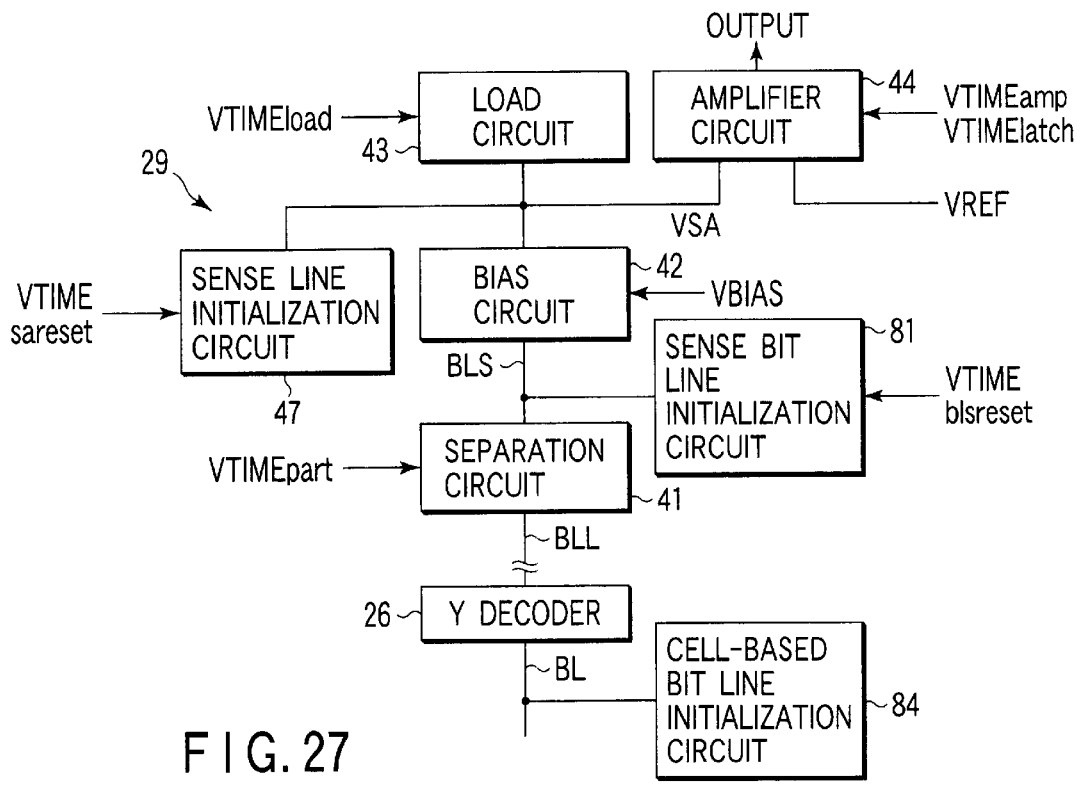
FIG. 27 is a circuit diagram showing part of a read circuit according to a sixth embodiment of the present invention.

FIG. 27 partially shows the configuration of the read circuit 29 according to the sixth embodiment of the present invention. This embodiment omits illustrations and corresponding descriptions with respect to portions equivalent to those in the read circuit 29 according to the first embodiment in FIG. 11.

The read circuit 29 according to this embodiment comprises the sense line initialization circuit 47, the sense bit line initialization circuit 81, and the cell-based bit line initialization circuit 84. The cell-based bit line initialization circuit 84 initializes the cell-based bit line BL.

This embodiment also provides the same effect as in FIG. 11. Also in this case, each of the sense line initialization circuit 47, the sense bit line initialization circuit 81, and the cell-based bit line initialization circuit 84 set an initial voltage to 0V or any other voltage.

Figure 28:
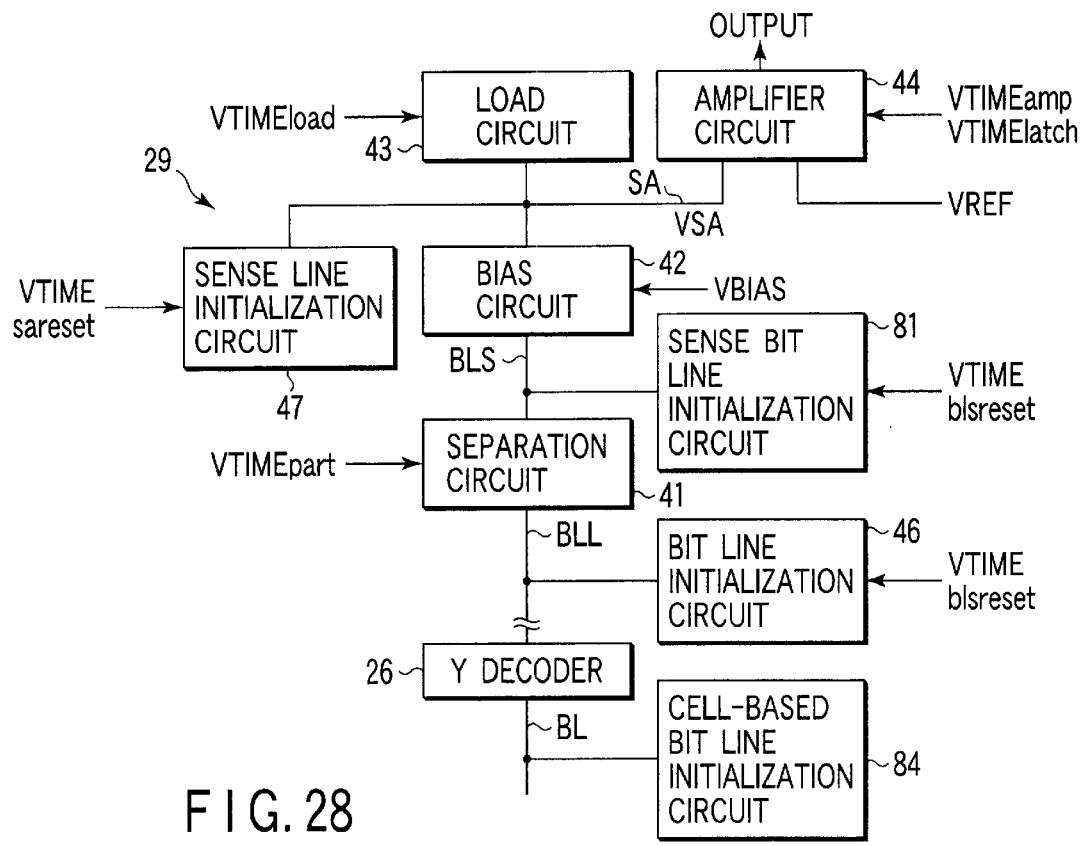
FIG. 28 is a circuit diagram showing part of a read circuit according to a seventh embodiment of the present invention.

FIG. 28 partially shows the configuration of the read circuit 29 according to the seventh embodiment of the present invention. This embodiment omits illustrations and corresponding descriptions with respect to portions equivalent to those in the read circuit 29 according to the first embodiment in FIG. 11.

The read circuit 29 according to this embodiment is provided with the bit line initialization circuit 46, the sense line initialization circuit 47, the sense bit line initialization circuit 81, and the cell-based bit line initialization circuit 84.

This embodiment also provides the same effect as in FIG. 11.

Also in this case, each of the bit line initialization circuit 46, the sense line initialization circuit 47, the sense bit line initialization circuit 81, and the cell-based bit line initialization circuit 84 set an initial voltage to 0V or any other voltage.

Figure 29:
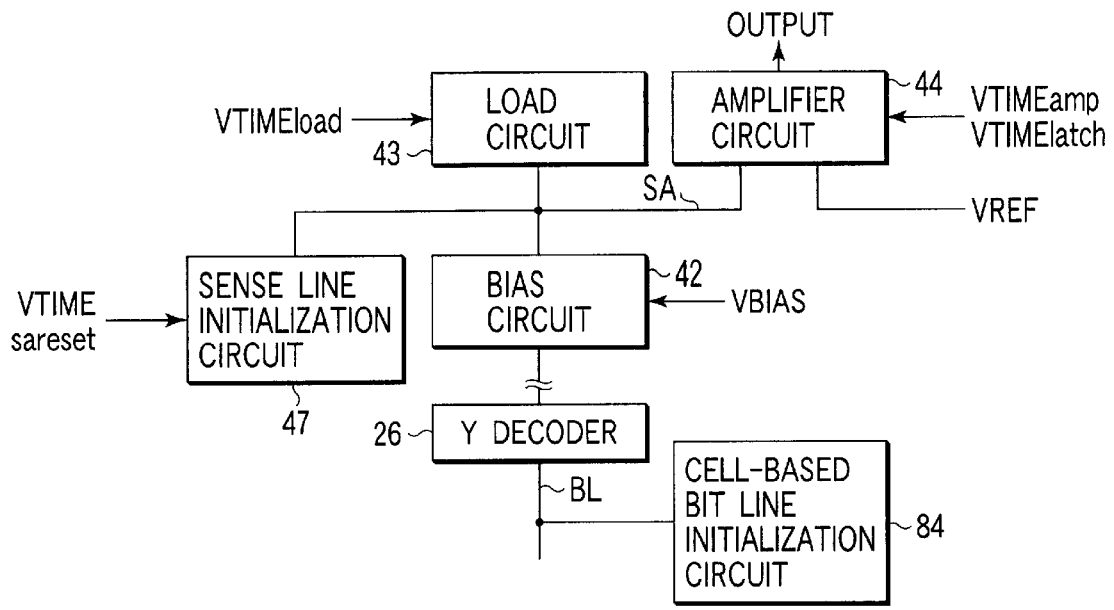
FIG. 29 is a circuit diagram showing part of a read circuit according to a eighth embodiment of the present invention.

FIG. 29 partially shows the configuration of the read circuit 29 according to the eighth embodiment of the present invention. This embodiment omits illustrations and corresponding descriptions with respect to portions equivalent to those in the read circuit 29 according to the first embodiment in FIG. 11.

Figure 6:
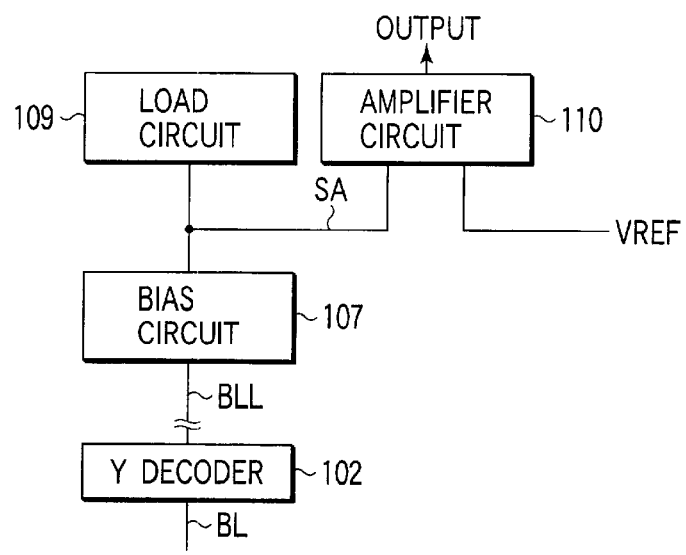
FIG. 6 shows another schematic configuration of a read circuit for the conventional flash memory different from that shown in FIG. 1.

The read circuit 29 according to this embodiment omits the separation circuit 41 in FIG. 11. The Y decoder 26 provides the separation circuit 41's function. The bit line initialization circuit 46 is omitted. The sense line initialization circuit 47 is provided. The cell-based bit line BL is connected to the cell-based bit line initialization circuit 84. Namely, this embodiment applies the present invention to a type of the conventional flash memory as shown in FIG. 6.

This embodiment also provides the same effect as in FIG. 11.

Figure 30:
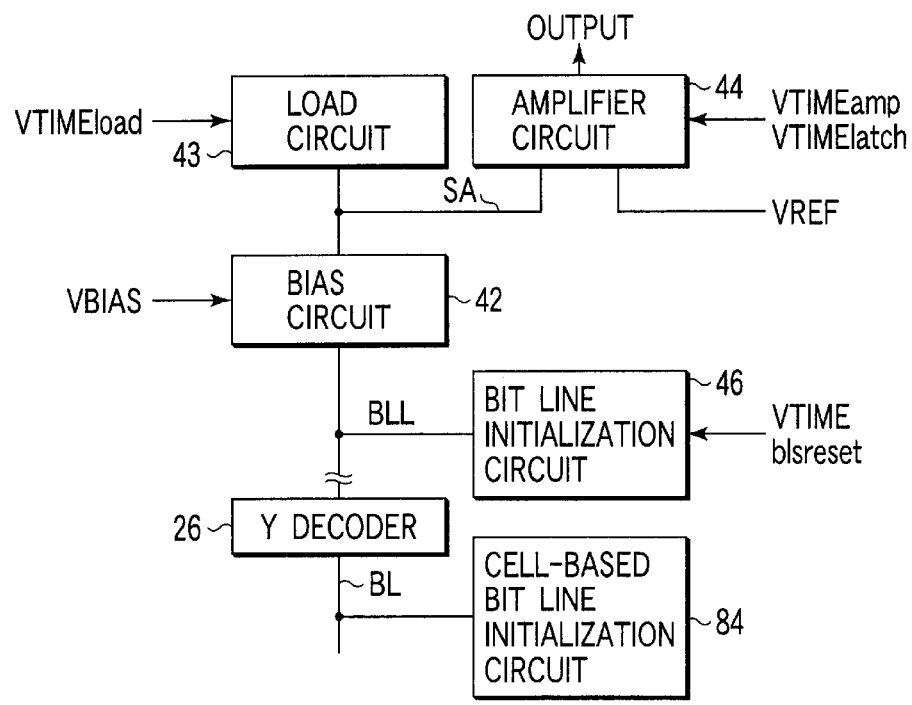
FIG. 30 is a circuit diagram showing part of a read circuit according to a ninth embodiment of the present invention.

FIG. 30 partially shows the configuration of the read circuit 29 according to the ninth embodiment of the present invention. This embodiment omits illustrations and corresponding descriptions with respect to portions equivalent to those in the read circuit 29 according to the first embodiment in FIG. 11.

The read circuit 29 according to this embodiment omits the separation circuit 41 in FIG. 11. The Y decoder 26 provides the separation circuit 41's function. The sense line initialization circuit 47 is omitted. The bit line initialization circuit 46 is provided. The cell-based bit line initialization circuit 84 is connected to the cell-based bit line BL.

This embodiment also provides the same effect as in FIG. 11.

Figure 31:
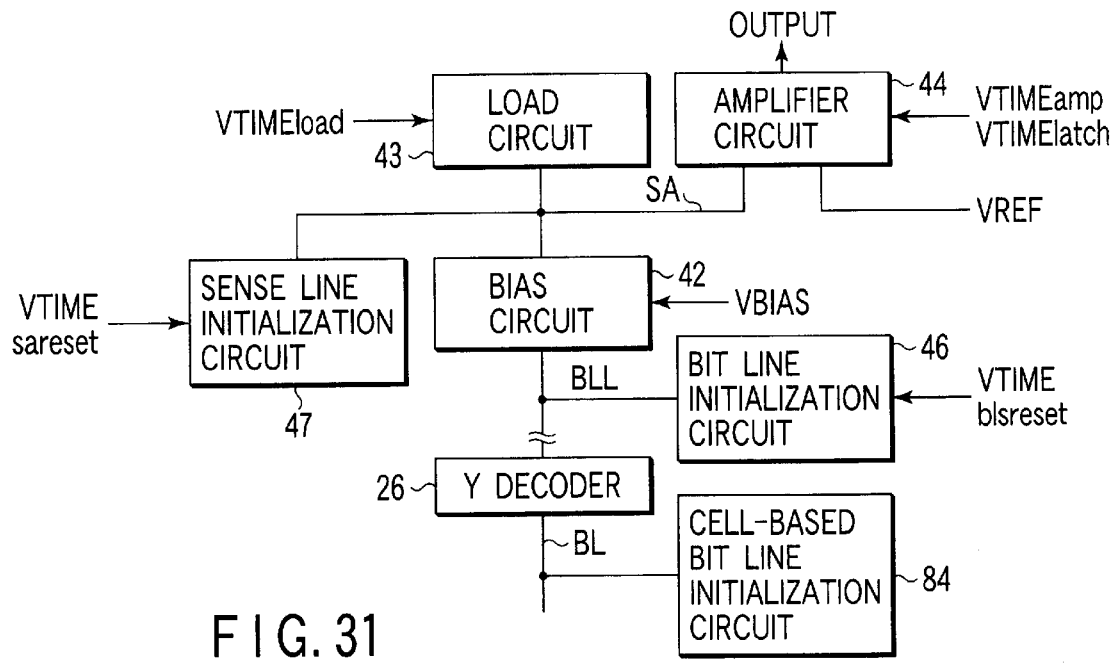
FIG. 31 is a circuit diagram showing part of a read circuit according to a tenth embodiment of the present invention.

FIG. 31 partially shows the configuration of the read circuit 29 according to the tenth embodiment of the present invention. This embodiment omits illustrations and corresponding descriptions with respect to portions equivalent to those in the read circuit 29 according to the first embodiment in FIG. 11.

The read circuit 29 according to this embodiment omits the separation circuit 41 in FIG. 11. The Y decoder 26 provides the separation circuit 41's function. Further, there are provided the bit line initialization circuit 46, the sense line initialization circuit 47, and the cell-based bit line initialization circuit 84.

This embodiment also provides the same effect as in FIG. 11.

Figure 32:
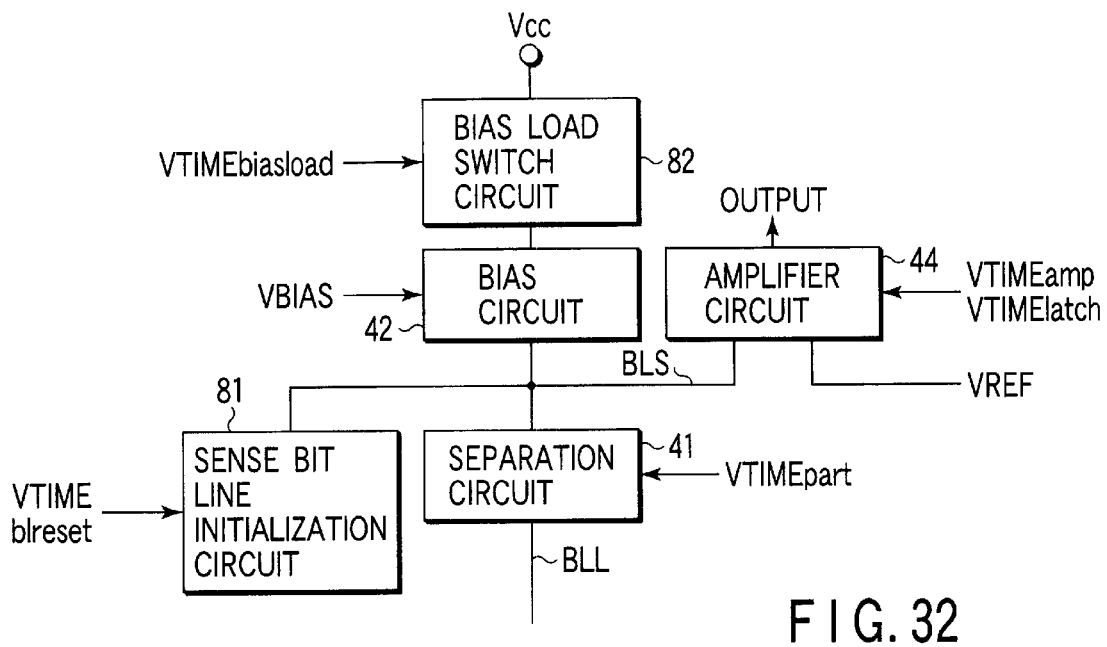
FIG. 32 is a circuit diagram showing part of a read circuit according to a eleventh embodiment of the present invention.

FIG. 32 partially shows the configuration of the read circuit 29 according to the eleventh embodiment of the present invention. This embodiment omits illustrations and corresponding descriptions with respect to portions equivalent to those in the read circuit 29 according to the first embodiment in FIG. 11.

Figure 5:
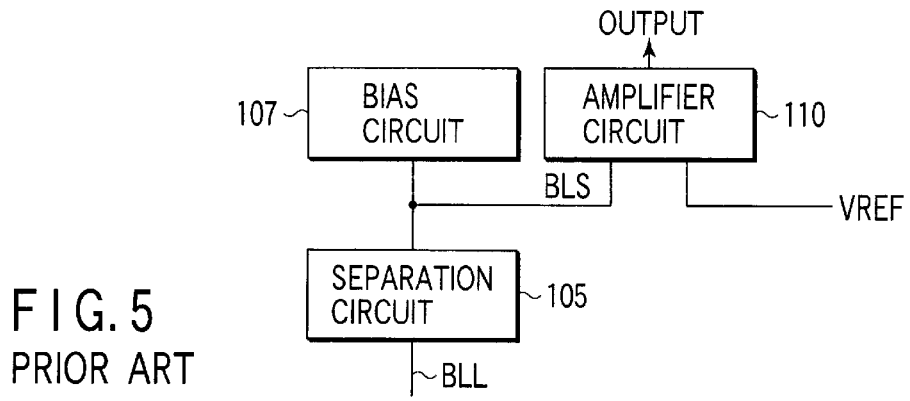
FIG. 5 shows a schematic configuration of a read circuit for the conventional flash memory different from that shown in FIG. 1.

The read circuit 29 according to this embodiment omits the load circuit 43 in FIG. 11. The bias circuit 42 provides the load circuit 43's function. Namely, this embodiment applies the present invention to a type of the conventional flash memory as shown in FIG. 5.

The following describes the read circuit 29 in FIG. 32 with respect to differences in FIG. 11. In this embodiment, the amplifier circuit 44 is connected to the sense bit line BLS. The amplifier circuit 44 senses data in a selected memory cell by comparing the sense bit line BLS's voltage VBLS with the reference voltage VREF. The sense bit line initialization circuit 81 is provided instead of the sense line initialization circuit 47 in FIG. 11. Further, a bias load switch circuit 82 is connected between the bias circuit 42 and the power supply voltage Vcc node.

Figure 33:
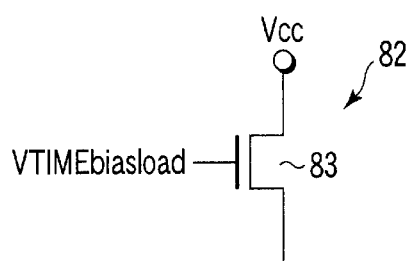
FIG. 33 is a circuit diagram showing a configuration of a bias load switch circuit in the read circuit in FIG. 32.

As shown in FIG. 33, for example, the bias load switch circuit 82 comprise an N-channel MOS transistor 83 in which the drain is connected to the power supply voltage Vcc node; the source is connected to the bias circuit 42; and the gate is supplied with the timing pulse VTIMEbiasload.

The timing pulse VTIMEbiasload is generated from the timing pulse generation circuit 49 in FIG. 11. The activation or inactivation timing may be same as for VTIMEload supplied to the load circuit 43.

In this embodiment, the bias circuit 42 keeps the sense bit line BLS's voltage VBLS lower than Vcc. The reference voltage VREF value needs to be modified accordingly.

If the sense bit line initialization circuit 81 is not provided, the sense bit line BLS is charged before the sense period. When the separation circuit 41 turns on thereafter, it is easily conceivable that the bias voltage VBIAS temporarily drops due to parasitic capacitances between the gate and the source and between the gate and the drain of the transistor 55 in FIG. 15.

Since this embodiment provides the sense bit line initialization circuit 81, however, the sense bit line BLS is initialized to 0V before the sense period. Like FIG. 11, it is possible to prevent the bias voltage VBIAS from dropping.

FIG. 34 partially shows the configuration of the read circuit 29 according to the twelfth embodiment of the present invention. This embodiment omits illustrations and corresponding descriptions with respect to portions equivalent to those in the read circuit 29 according to the first embodiment in FIG. 11.

Figure 7:
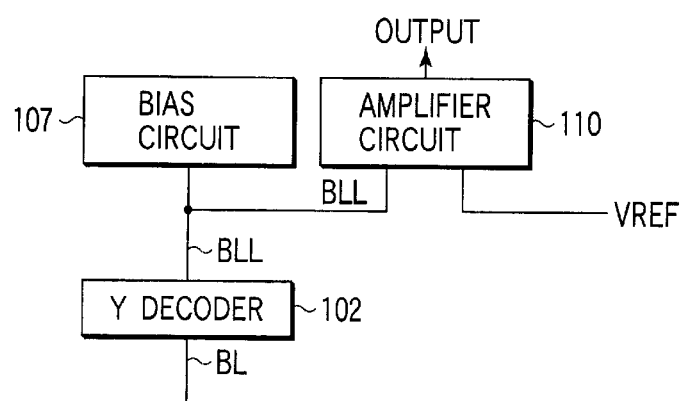
FIG. 7 shows yet another schematic configuration of a read circuit for the conventional flash memory different from that shown in FIG. 1.

The read circuit 29 according to this embodiment omits the separation circuit 41 in the read circuit 29 according to the embodiment in FIG. 32. The Y decoder 26 provides the separation circuit 41's function. The bit line initialization circuit 46 is provided. Namely, this embodiment applies the present invention to a type of the conventional flash memory as shown in FIG. 7. The amplifier circuit 44 senses data by comparing the bit line BLL's voltage VBLL with the reference voltage VREF.

This embodiment also provides the same effect as in FIG. 11.

As shown in FIG. 34, the bit line initialization circuit 84 may be provided for initializing a cell-based bit line BL voltage. The bit line initialization circuit 84 is not necessarily provided.

FIG. 35 partially shows the configuration of the read circuit 29 according to the thirteenth embodiment of the present invention. This embodiment omits illustrations and corresponding descriptions with respect to portions equivalent to those in the read circuit 29 according to the first embodiment in FIG. 11.

As mentioned above, each of the first through twelfth embodiments is provided with one or more of the bit line initialization circuit 46 for setting a bit line BLL voltage, the sense line initialization circuit 47 for initializing a sense line SA voltage, and the sense bit line initialization circuit 81 for initializing a sense bit line BLS voltage. The corresponding portion in each initialization circuit is set to 0V during the address selection period. As shown in FIG. 35, however, there may be provided an N-channel MOS transistor 85 having its source and drain connected between both ends of the separation circuit 41, namely between the bit line BLS and the bit line BLL. The transistor's gate may be controlled so that the transistor 85 goes on during the address selection period.

According to this embodiment, the cell-based bit line is initialized in advance. When the transistor 85 goes on during the address selection period in which the bit line BLL is set to 0V, the sense bit line BLS is also initialized to 0V. Additionally, the sense line SA is also initialized to 0V via the bias circuit 42. This prevents the bias voltage VBIAS supplied to the bias circuit 42 from dropping.

The bias voltage VBIAS itself can be prevented from dropping by connecting a large capacitance to a node where the bias voltage VBIAS is output in the circuit in FIG. 16.

As shown in FIG. 10, the memory cell array 23 for each of the above-mentioned embodiments is a so-called NOR-type memory cell array in which the nonvolatile transistor's source-drain is inserted between each bit line BL and source line SL and its gate is connected to the word line WL. The memory cell array 23 may be a NAND-type unit as shown in FIG. 36 or a byte-type EEPROM unit as shown in FIG. 37.

The NAND-type unit as shown in FIG. 36 is provided with serially connected (n+1) nonvolatile transistors MC sandwiched by two select transistors SGT1 and SGT2 between the bit line BL and the source line SL. Gates of two select transistors SGT1 and SGT2 are connected to select gate lines SG1 and SG2, respectively. Control gates of (n+1) nonvolatile transistors MC are connected to (n+1) word lines WL0 through WLn.

The byte-type EEPROM unit as shown in FIG. 37 is disclosed in U.S. patent application Ser. No. 09/393,201 and comprises a memory cell MC and two select transistors SGT1 and SGT2. The memory cell MC comprises a control gate and a floating gate and has the same structure as the flash EEPROM memory cell. The two s elect transistors SGT1 and SGT2 are each connected to both ends of the memory cell MC. The select transistor SGT1 is connected to the bit line BL. The select transistor SGT2 is connected to the source line SL.

The memory cell MC and the select transistors SGT1 and SGT2 constitute a single memory cell unit. A memory cell array comprises a plurality of memory cell units arranged in an array.

From the viewpoint of a structure, the byte-type EEPROM unit in FIG. 37 can be considered to be a unity of memory cells in a NAND-type flash EEPROM.

As mentioned above, the present invention can provide a nonvolatile semiconductor memory and a control method thereof which can prevent a read delay or a read error and suppress an increase in current consumption by stabilizing a bias voltage supplied to the bias circuit on the read circuit.

Additional advantage s and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a memory cell array having cell-based bit lines and nonvolatile memory cells connected thereto, said nonvolatile memory cell is selected according to address signals in an address selection period;
   a bit line to which a signal voltage of said cell-based bit line is transmitted;
   a cell-based bit line decoder circuit for connecting said cell-based bit line in said memory cell array to said bit line in said address selection period according to said address signal;
   a sense bit line to which a signal voltage of said bit line is transmitted;
   a separation circuit connected between said sense bit line and said bit line, for electrically separating said sense bit line from said bit line;
   a sense line to which a signal voltage of said sense bit line is transmitted;
   a bias circuit connected between said sense line and said sense bit line, for supplying said sense bit line with a predefined voltage;
   a load circuit connected to said sense line;
   an amplifier circuit supplied with a voltage of said sense line and a reference voltage, for amplifying a difference between both voltages; and
   a first initialization circuit activated according to a first control signal in said address selection period, for supplying said sense line with a specified voltage.

2. The memory device according to claim 1, further comprising a second initialization circuit activated according to a second control signal in said address selection period, for supplying said cell-based bit line with the specified voltage.

3. The memory device according to claim 1, further comprising a second initialization circuit activated according to a second control signal in said address selection period, for supplying said bit line with the specified voltage.

4. The memory device according to claim 1, further comprising a second initialization circuit activated according to a second control signal in said address selection period, for supplying said sense bit line with the specified voltage.

5. The memory device according to claim 1, wherein said load circuit comprising:
   a first P-channel transistor in which one of a source and a drain is connected to said sense line; and
   a switch circuit connected between a power supply node and the other of the source and the drain of said first transistor.

6. The memory device according to claim 1, wherein said bias circuit comprising:
   a bias voltage generation circuit for generating a specified bias voltage; and
   a first N-channel transistor in which one of a source and a drain is connected to said sense line, the other of the source and the drain is connected to said sense bit line, and a gate is supplied with a bias voltage generated from said bias voltage generation circuit.

7. The memory device according to claim 1, wherein said separation circuit comprising:
   a first N-channel transistor in which one of a source and a drain is connected to said sense bit line, the other of the source and the drain is connected to said bit line, and a gate is supplied with a control signal.

8. The memory device according to claim 1, wherein said amplifier circuit comprising:
   a differential amplifier circuit supplied with the voltage of said sense line and the reference voltage, for amplifying the difference between both voltages; and
   a data latch circuit for latching output data from said differential amplifier circuit.

9. The memory device according to claim 1, wherein said memory cell array is a NOR-type memory cell array.

10. The memory device according to claim 1, wherein said memory cell array is a NAND-type memory cell array having a NAND-type unit.

11. The memory device according to claim 1, wherein said memory cell array having a memory cell unit comprises a single memory cell and two select transistors sandwiching said memory cell.

12. A nonvolatile semiconductor memory device comprising:
   a memory cell array having cell-based bit lines and nonvolatile memory cells connected thereto, said nonvolatile memory cell is selected according to address signals in an address selection period;

a bit line to which a signal voltage of said cell-based bit line is transmitted;

a cell-based bit line decoder circuit for connecting said cell-based bit line in said memory cell array to said bit line in said address selection period according to said address signal;

a sense bit line to which a signal voltage of said bit line is transmitted;

a separation circuit connected between said sense bit line and said bit line, for electrically separating said sense bit line from said bit line;

a sense line to which a signal voltage of said sense bit line is transmitted;

a bias circuit connected between said sense line and said sense bit line, for supplying said sense bit line with a predefined voltage;

a load circuit connected to said sense line;

an amplifier circuit supplied with a voltage of said sense line and a reference voltage, for amplifying a difference between both voltages; and a first initialization circuit activated according to a first control signal in said address selection period, for supplying said sense bit line with a specified voltage.

13. The memory device according to claim 12, further comprising a second initialization circuit activated according to a second control signal in said address selection period, for supplying said cell-based bit line with the specified voltage.

14. The memory device according to claim 12, further comprising a second initialization circuit activated according to a second control signal in said address selection period, for supplying said bit line with the specified voltage.

15. The memory device according to claim 12, wherein said load circuit comprising:

a first P-channel transistor in which one of a source and a drain is connected to said sense line; and a switch circuit connected between a power supply node and the other of the source and the drain of said first transistor.

16. The memory device according to claim 12, wherein said bias circuit comprising:

a bias voltage generation circuit for generating a specified bias voltage; and a first N-channel transistor in which one of a source and a drain is connected to said sense line, the other of the source and the drain is connected to said sense bit line, and a gate is supplied with a bias voltage generated from said bias voltage generation circuit.

17. The memory device according to claim 12, wherein said separation circuit comprising:

a first N-channel transistor in which one of a source and a drain is connected to said sense bit line, the other of the source and the drain is connected to said bit line, and a gate thereof is supplied with a control signal.

18. The memory device according to claim 12, wherein said amplifier circuit comprising:

a differential amplifier circuit supplied with the voltage of said sense line and the reference voltage, for amplifying the difference between both voltages; and a data latch circuit for latching output data from said differential amplifier circuit.

19. The memory device according to claim 12, wherein said memory cell array is a NOR-type memory cell array.

20. The memory device according to claim 12, said memory cell array is a NAND-type memory cell array having a NAND-type unit.

21. The memory device according to claim 12, wherein said memory cell array having a memory cell unit comprises a single memory cell and two select transistors sandwiching said memory cell.

22. A nonvolatile semiconductor memory device comprising:

a memory cell array having cell-based bit lines and nonvolatile memory cells connected thereto, said nonvolatile memory cell is selected according to address signals in an address selection period;

a bit line to which a signal voltage of said cell-based bit line is transmitted;

a cell-based bit line decoder circuit for connecting said cell-based bit line in said memory cell array to said bit line in said address selection period according to said address signal;

a sense line to which a signal voltage of said bit line is transmitted;

a bias circuit connected between said sense line and said bit line, for supplying said bit line with a predefined voltage;

a load circuit connected to said sense line;

an amplifier circuit supplied with a voltage of said sense line and a reference voltage, for amplifying a difference between both voltages; and a first initialization circuit activated according to a first control signal in said address selection period, for supplying said sense line with a specified voltage.

23. The memory device according to claim 22, further comprising a second initialization circuit activated according to a second control signal in said address selection period, for supplying said cell-based bit line with the specified voltage.

24. The memory device according to claim 22, further comprising a second initialization circuit activated according to a second control signal in said address selection period, for supplying said bit line with the specified voltage.

25. The memory device according to claim 22, wherein said load circuit comprising:

a first P-channel transistor in which one of a source and a drain is connected to said sense line; and a switch circuit connected between a power supply node and the other of the source and the drain of said first transistor.

26. The memory device according to claim 22, wherein said bias circuit comprising:

a bias voltage generation circuit for generating a specified bias voltage; and a first N-channel transistor in which one of a source and a drain is connected to said sense line, the other of the source and the drain is connected to a sense bit line, and a gate is supplied with a bias voltage generated from said bias voltage generation circuit.

27. The memory device according to claim 22, wherein said amplifier circuit comprising:

a differential amplifier circuit supplied with the voltage of said sense line and the reference voltage, for amplifying the difference between both voltages; and a data latch circuit for latching output data from said differential amplifier circuit.

28. The memory device according to claim 22, wherein said memory cell array is a NOR-type memory cell array.

29. The memory device according to claim 22, wherein said memory cell array is a NAND-type memory cell array having a NAND-type unit.

30. The memory device according to claim 22, wherein said memory cell array having a memory cell unit comprises a single memory cell and two select transistors sandwiching said memory cell.

31. A nonvolatile semiconductor memory device comprising:

a memory cell array having cell-based bit lines and nonvolatile memory cells connected thereto, said nonvolatile memory cell is selected according to address signals in an address selection period;

a bit line to which a signal voltage of said cell-based bit line is transmitted;

a cell-based bit line decoder circuit for connecting said cell-based bit line in said memory cell array to said bit line in said address selection period according to said address signal;

a sense line to which a signal voltage of said bit line is transmitted;

a bias circuit connected between said sense line and said bit line, for supplying said bit line with a predefined voltage;

a load circuit connected to said sense line;

an amplifier circuit supplied with a voltage of said sense line and a reference voltage, for amplifying a difference between both voltages; and a first initialization circuit activated according to a first control signal in said address selection period, for supplying said bit line with a specified voltage.

32. The memory device according to claim 31, further comprising a second initialization circuit activated according to a second control signal in said address selection period, for supplying said cell-based bit line with the specified voltage.

33. The memory device according to claim 31, wherein said load circuit comprising:

a first P-channel transistor in which one of a source and a drain is connected to said sense line; and a switch circuit connected between a power supply node and the other of the source and the drain of said first transistor.

34. The memory device according to claim 31, wherein said bias circuit comprising:

a bias voltage generation circuit for generating a specified bias voltage; and a first N-channel transistor in which one of a source and a drain is connected to said sense line, the other of the source and the drain is connected to a sense bit line, and a gate is supplied with a bias voltage generated from said bias voltage generation circuit.

35. The memory device according to claim 31, wherein said amplifier circuit comprising:

a differential amplifier circuit supplied with the voltage of said sense line and the reference voltage, for amplifying the difference between both voltages; and a data latch circuit for latching output data from said differential amplifier circuit.

36. The memory device according to claim 31, wherein said memory cell array is a NOR-type memory cell array.

37. The memory device according to claim 31, wherein said memory cell array is a NAND-type memory cell array having a NAND-type unit.

38. The memory device according to claim 31, wherein said memory cell array having a memory cell unit comprises a single memory cell and two select transistors sandwiching said memory cell.

39. A nonvolatile semiconductor memory device comprising:

a memory cell array having cell-based bit lines and nonvolatile memory cells connected thereto, said nonvolatile memory cell is selected according to address signals during an address selection period;

a bit line to which a signal voltage of said cell-based bit line is transmitted;

a cell-based bit line decoder circuit for connecting said cell-based bit line in said memory cell array to said bit line in said address selection period according to said address signal;

a bias circuit connected between a power supply node and said bit line, for supplying said bit line with a predefined voltage according to a first control signal;

an amplifier circuit supplied with a voltage of said bit line and a reference voltage, for amplifying a difference between both voltages; and a first initialization circuit activated according to a second control signal in said address selection period, for supplying said bit line with a specified voltage.

40. The memory device according to claim 39, further comprising a second initialization circuit activated according to a third control signal in said address selection period, for supplying said cell-based bit line with the specified voltage.

41. The memory device according to claim 39, wherein said bias circuit comprising:

a bias voltage generation circuit for generating a specified bias voltage; and a first N-channel transistor in which one of a source and a drain is connected to said bit line, the other of the source and the drain is connected to said power supply node, and a gate is supplied with a bias voltage generated from said bias voltage generation circuit.

42. The memory device according to claim 39, wherein said amplifier circuit comprising:

a differential amplifier circuit supplied with the voltage of said sense line and the reference voltage, for amplifying the difference between both voltages; and a data latch circuit for latching output data from said differential amplifier circuit.

43. The memory device according to claim 39, wherein said memory cell array is a NOR-type memory cell array.

44. The memory device according to claim 39, wherein said memory cell array is a NAND-type memory cell array having a NAND-type unit.

45. The memory device according to claim 39, wherein said memory cell array having a memory cell unit comprises a single memory cell and two select transistors sandwiching said memory cell.

46. A nonvolatile semiconductor memory device comprising:

a bit line to which a read voltage is transmitted from a nonvolatile memory cell storing data;

an amplifier circuit having a first and a second input nodes, respectively supplies these first and second input nodes with an input voltage corresponding to the read voltage on said bit line and a reference voltage, for amplifying a difference between both voltages;

a bias circuit having a current path inserted between said bit line and said first input node of said amplifier circuit, for supplying a specified voltage to said first input node of said amplifier circuit; and an initialization circuit activated according to a first control signal in an address selection period, for supplying a predetermined voltage to at least one of both ends of said current path of said bias circuit.

47. A method of controlling a nonvolatile semiconductor memory device in which a bias circuit is operated, thereby setting a data sense node to a prescribed potential in a data sense period, the voltage at the data sense node is changed in accordance with the data read from a memory cell, and an amplifier circuit compares the voltage with a reference voltage in the sense period, thereby sensing the data, said method comprising:

setting the data sense node at the prescribed potential by an initialization circuit in an address selection period.

* * * * *